US006691283B1

(12) United States Patent
Gashkov et al.

(10) Patent No.: US 6,691,283 B1
(45) Date of Patent: Feb. 10, 2004

(54) OPTIMIZATION OF COMPARATOR ARCHITECTURE

(75) Inventors: Sergej B. Gashkov, Moscow (RU); Alexander E. Andreev, San Jose, CA (US); Aiguo Lu, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 220 days.

(21) Appl. No.: 10/017,792

(22) Filed: Dec. 12, 2001

(51) Int. Cl.[7] .............................................. G06F 17/50
(52) U.S. Cl. ........................................................ 716/1
(58) Field of Search .............................. 716/1, 2, 7, 8, 716/9, 10, 11, 12, 13, 14; 341/80

(56) References Cited

U.S. PATENT DOCUMENTS 4,187,500 A * 2/1980 Stakhov et al. ............. 341/80

* cited by examiner

Primary Examiner—Leigh M. Garbowski
(74) Attorney, Agent, or Firm—Westman, Champlin

(57) ABSTRACT

A circuit embodied in an integrated circuit is characterized by an architecture having a minimal depth defined by a recursive expansion of output functions $h\_n = OR(h\_k, AND(v\_k, h\_\{n-k\}))$ and $v\_n = AND(v\_k, v\{n-k\})$, where $k = F\_l$ and $n-k = F\_{\{l-1\}}$, satisfies $F\_l < n = F\_{\{l+1\}}$, $\{F\_l\}$ is a Fibonacci series and n is the number of bits of an input to the circuit. In one form, the circuit is a comparator having output functions $h\_n$ and $v\_n$ that depend from input functions $U[i] = AND(NOT(A[i]), B[i])$ and $V[i] = OR(NOT(A[i]), B[i])$, where $A[i]$ and $B[i]$ are inputs to the comparator, and functions $h\_n$, $v\_n$ defined as $h\_n = h\_n(U[0], U[1], V[1], \ldots, U[n-1], V[n-1]) = OR(U[n-1], AND(V[n-1], U[n-2]), \ldots, AND(V[n-1], \ldots, V[1], U[0]))$, and $v\_n = v\_n(V[0], \ldots, V[n-1]) = AND(V[0], \ldots, V[n-1])$. In one form, the comparator includes an LEQ input that identifies strict or non-strict inequality comparison by the comparator. The depth is further minimized by a distribution of negations of elements forming the circuit. A computer process is described to carry out the design, including mapping 2-input elements from a cell library of 3-input elements.

21 Claims, 17 Drawing Sheets

NDND

NRNR

NNR

NND

ANDND

AO21

AO3

AO1

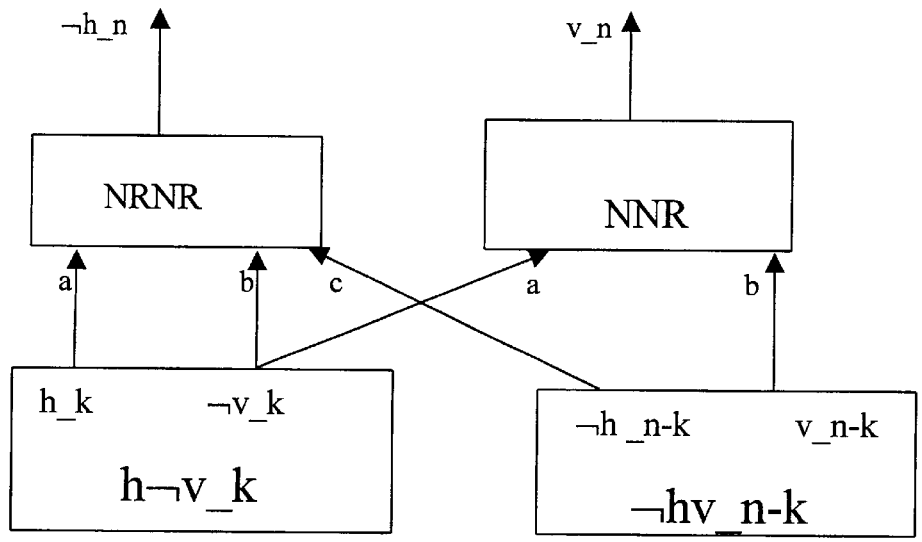
FIG. 3A - $\neg hv\_n$
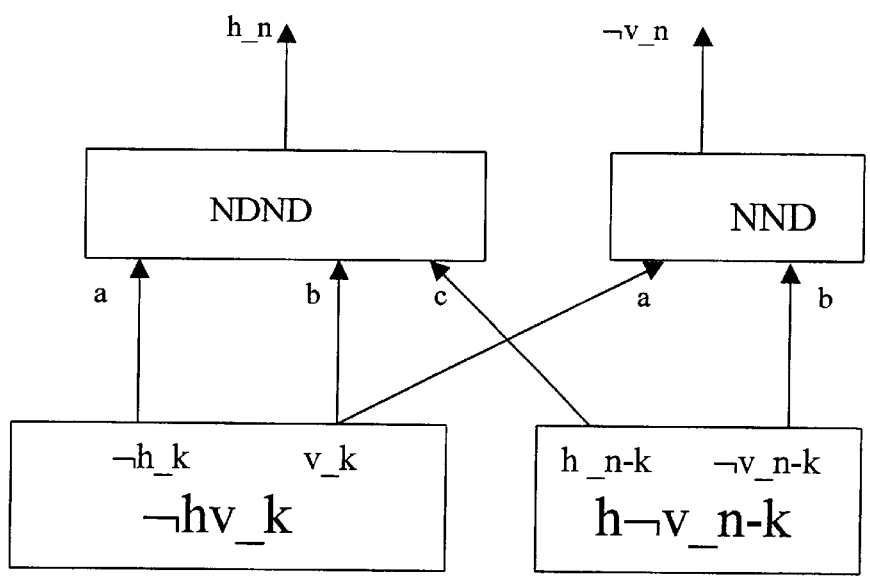
FIG. 3B - $h\neg v\_n$

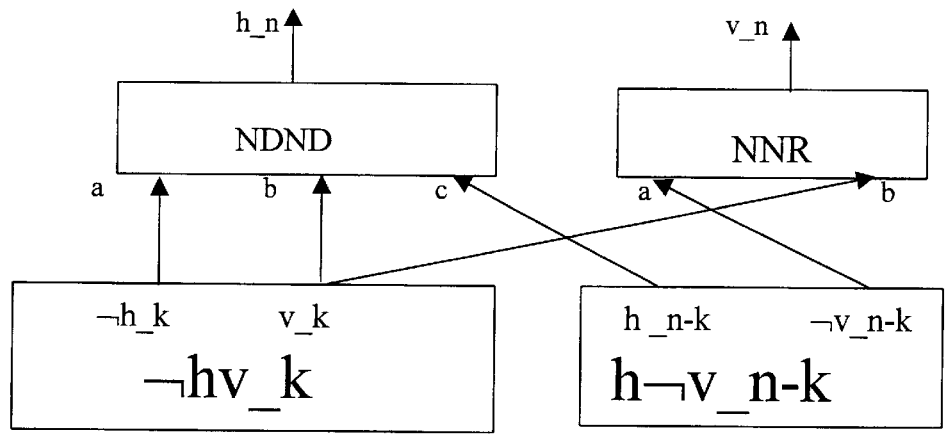
FIG. 4 - hv_n
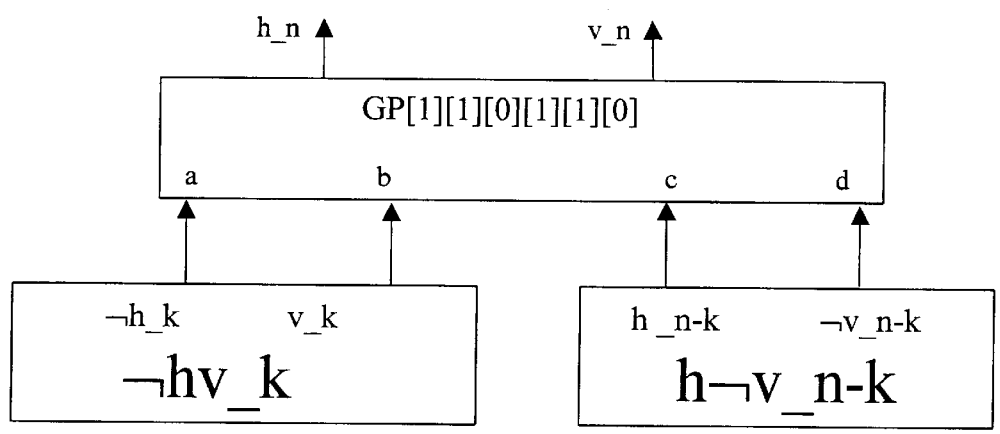
FIG. 5 - hv_n

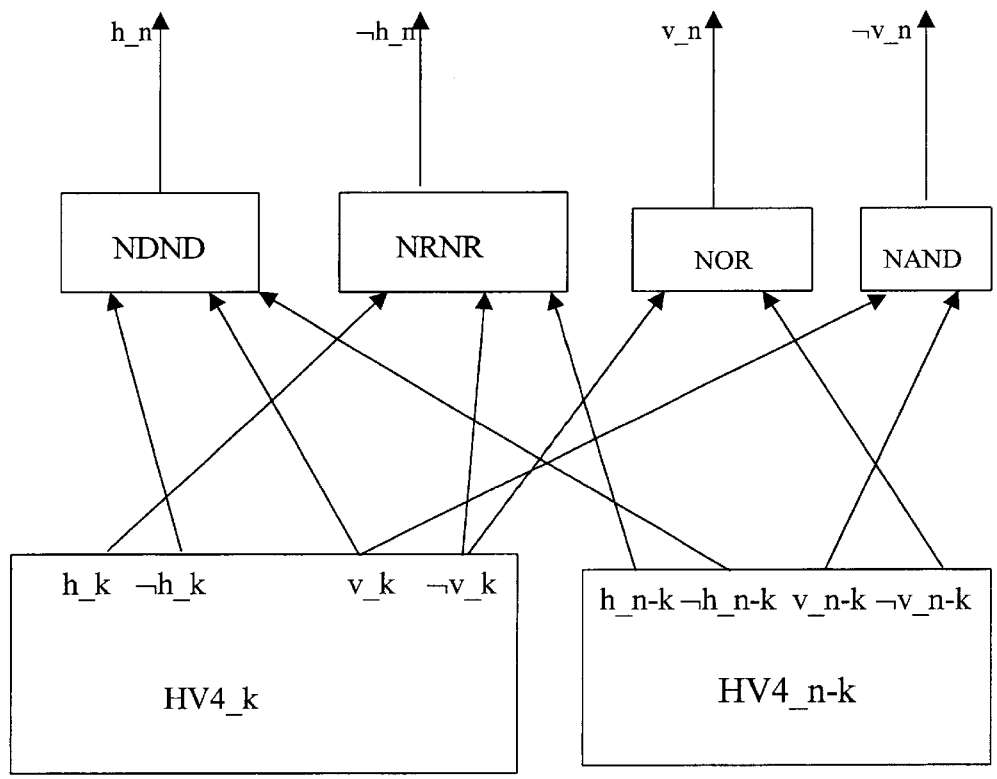
FIG. 7 - HV4_n

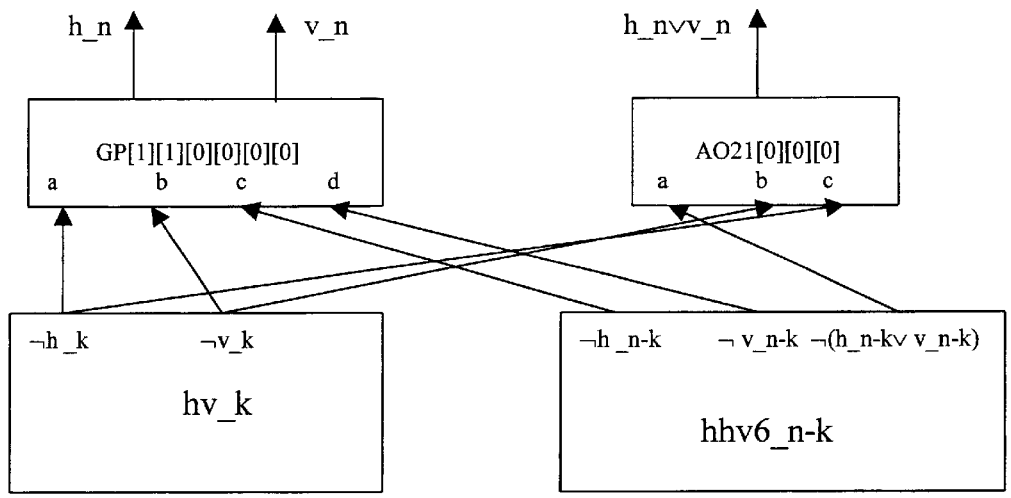
FIG. 11A - hhv_n
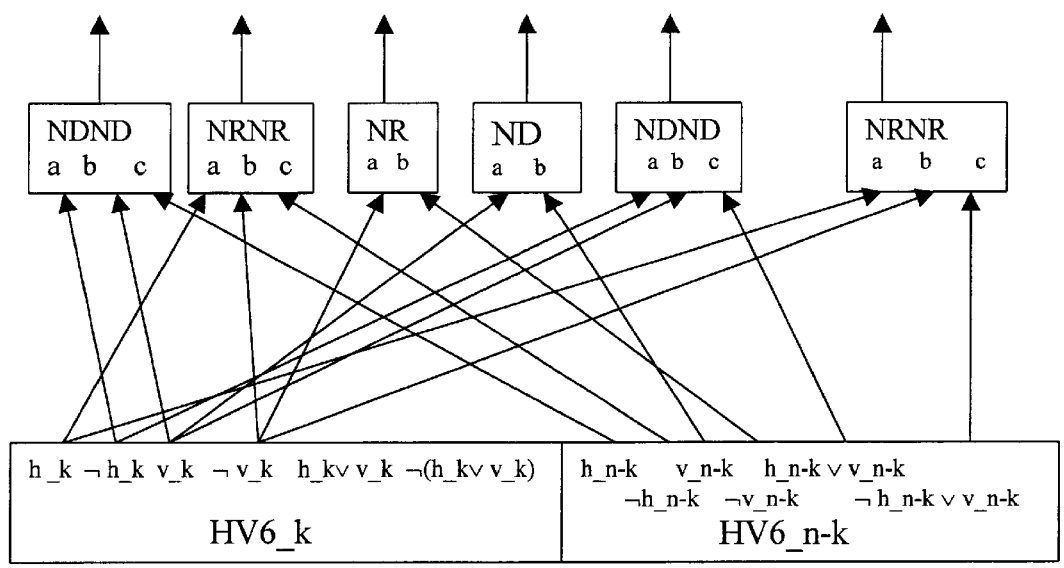
FIG. 11B

OPTIMIZATION OF COMPARATOR ARCHITECTURE

FIELD OF THE INVENTION

This invention relates to digital comparators, and particularly to comparators for use in very large scale integrated circuits (VLSI circuits).

BACKGROUND OF THE INVENTION

Comparators are widely used in VLSI circuits, and are one of the most commonly used datapath modules in application specific integrated circuits (ASICs). The performance of the implemented comparator highly affects the quality of the VLSI circuit, and its timing closure.

Prior digital comparators have employed an architecture based on AND and OR elements. One such circuit, known as a dichotomizing circuit, achieves a circuit depth of 2 log_2n+O(1) and a complexity of 3n−O(log_2n), where n is the number of bits of the comparator. While the complexity of such comparators is minimally acceptable, the depth, and hence the time delay, is large.

The present invention is directed to a comparator architecture based on a Fibonacci series that provides an approach to the design of comparators based on the global analysis of their Boolean identities. The resulting comparators have smaller depth and time delay. In some cases, circuit area is reduced.

SUMMARY OF THE INVENTION

In accordance with the present invention a comparator is embodied in an integrated circuit and is characterized by an architecture having output functions h_n and v_n that depend from input functions U[i]=AND(NOT(A[i]), B[i]) and V[i]=OR(NOT(A[i]), B[i]), where A[i] and B[i] are inputs to the comparator, and functions h_n, v_n are defined as $$h\_n = h\_n(U[0], U[1], V[1], \ldots, U[n-1], V[n-1])$$
$$= \mathrm{OR}\ (U[n-1], \mathrm{AND}\ (V[n-1], U[n-2]), \ldots, \mathrm{AND}$$
$$(V[n-1], \ldots, V[1], U[0])), \text{ and}$$
$$v\_n = v\_n(V[0], \ldots, V[n-1])$$
$$= \mathrm{AND}(V[0], \ldots, V[n-1]).$$

The comparator is further characterized by a minimal depth defined by a recursive expansion of functions h_n=OR(h_k, AND(v_k, h_{n−k})) and v_n=AND(v_k, v{n−k}), where k=F_l and n−k=F_{l−1}, l satisfies F_l<n=F_{l+1}, where {F_l} is a Fibonacci series and n is the number of bits of an input to the comparator.

In some embodiments, a distribution of negations of modules of the comparator is optimized. A set of delay vectors is identified and recursively compared to derive a set of minimum vectors. A vector having a minimum norm is selected from the set of minimum vectors.

The comparator is characterized by the use of logic elements having a function OR(NOT(a),b) instead of EXCLUSIVE OR functions. In some embodiments, the comparator is further characterized by the inclusion of OR logical functions in place of NOR functions and AND logical functions in place of NAND functions.

In some embodiments, a LEQ flag is input to the comparator to signify strict or non-strict comparison of the input numbers.

In some embodiments, the comparator is constructed using 2-input elements mapped from 3-input elements in a library. In other embodiments, the comparator is constructed using 4-input elements constructed from 2-input elements. In other embodiments, the comparator is constructed having six outputs.

In other embodiments, the invention is manifest in a computer readable program containing code that, when executed by a computer, causes the computer to perform the process steps to design a comparator for an integrated circuit based on a Fibonacci series and employing 2-input elements of minimal depth.

BRIEF DESCRIPTION OF THE DRAWINGS

FIGS. 3A and 3B illustrate recursive construction of modules for a comparator.

FIGS. 4–7 illustrate various comparators formed by recursive construction.

FIGS. 11A and 11B illustrate 6-output Fibonacci comparators according to embodiments of the present invention.

DETAILED DESCRIPTION OF THE PREFERRED EMBODIMENTS

Figure 1A:
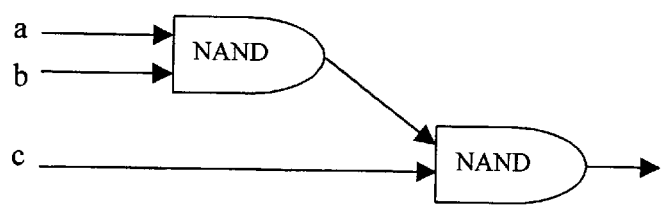
FIGS. 1A–1H are illustrations of logic functions as used in the description of preferred embodiments of the present invention.

In the following discussion, the Boolean representations of the comparator are described in Section 1. A comparator architecture is described in Sections 2–4 that results in a comparator architecture in IC chips having smaller circuit depth, and hence smaller time delay, as compared to prior comparators.

1. Boolean Representation of Comparator

An n digit comparator is a circuit with inputs A=(A[0], ..., A[n−1]) and B=(B[0], ..., B[n−1]) and outputs LT_LE and GE_GT. One output is the negation of the other output. The comparator performs the comparison of the two digital numbers. If input A is an unsigned number having bits A[0], A[1], ..., A[n−1], and if input B is an unsigned number with bits B[0], B[1], ..., B[n−1], then, A=$\Sigma 2^i$A[i] and B=$\Sigma 2^i$B[i]. Output LT_LE=1 if and only if A<B; output LT_LE=0 if and only if A=B. Output GT_GE=1 if and only if A=B, and output GT_GE=0 if and only if A<B.

The Boolean function at output LT_LE is $$h\_n(U[0], U[1], V[1], \ldots, U[n-1], V[n-1]) =$$
$$U[n-1] \vee V[n-1] \& U[n-2] \vee V[n-1] \& V[n-2] \&$$
$$U[n-3] \vee \ldots \vee V[n-1] \& V[n-2] \& \ldots \& V[1] \& U[0],$$

where $U[i] = \neg A[i] \& B[i]$ and $V[i] = \neg A[i] \vee B[i]$, for $0 \leq i \leq n-1$. As used herein the symbol & means a conjunction (logical multiplication), the symbol $\vee$ means disjunction (logical addition), and the symbol $\neg$ means logical negation. Function $U[i]=1$ only if $A[i]<B[i]$, in other words if $A[i]=0$ and $B[i]=1$. Function $V[i]=0$ only if $A[i]>B[i]$, in other words if $A[i]=1$ and $B[i]=0$.

Dichotomizing comparators of the prior art employed the function $\neg A[i] \oplus B[i] = \text{XNOR}(A[i], B[i])$, where $\text{XNOR}(A, B) = \neg A \& \neg B \vee A \& B$ is the Exclusive Nor operation ($\text{XNOR}(A, B)=1$ if and only if $A[i]=B[i]$). The symbol $\oplus$ means association (logical or). The present invention employs the function $V\_i = \neg A[i] \vee B[i]$ in place of the XNOR function.

If A<B, then one digit in number A (i.e., index i) is less than the same digit in number B, that is $0=A[i]<B[i]=1$, and all digits with indexes greater than i (if they exist) are pair-wise equal. Then, $U[i]=1$, $U[j]=0$ and $V[j]=1$, where $j>i$ irrespective of the choice for $V[j]$. The function $$h\_n = h\_n(U[0], U[1], V[1], \ldots, U(n-1], V[n-1])$$
$$= U[n-1] \vee V[n-1] \& U[n-2] \vee V[n-1]V[n-2] \&$$
$$U[n-3] \vee \ldots \vee V[n-1] \& V(n-2] \& \ldots \& V[1] \& U[0]$$

may be described as $$h'\_{n-i} \vee v\_{(n-i)} \& h\_{i},$$

where the function $$h'\_{n-i} = U[n-1] \vee V(n-1] \& U[n-2] \vee V[n-1] \&$$
$$V[n-2] \& U[n-3] \vee \ldots \vee V[n-1] \&$$
$$V[n-2] \& \ldots \& V[i+1] \& U[i]$$
$$= h\_{n-i}(U[i], U[i+1], V[i+1], \ldots, U[n-1], V[n-1]),$$

and the function $v\_{[n-i}$ represents a conjunction $V[n-1] \& V[n-2] \& \ldots V[i]$. Therefore, $$h\_n = h'\_{n-i} \vee v\{n-i\} \& h\_{i}$$
$$= h'\_{n-i}$$
$$= V\_{n-1} \& \ldots \& V\_{i+1} \& U\_{i} = 1.$$

Thus, since $U\_{i}=1$, $U\_{j}=0$ and $V\_{j}=1$ where $j>i$, $h\_n=1$. Inversely, if $h\_n=1$, by selecting the greatest i such that $V[n-1] \& \ldots \& V[i+1] \& U[i]=1$, $U[i]=1$, $V[j]=1$ and $U[j]=0$, where $j>i$. Otherwise, $U[n-1]=1$, and $A[n-1]=0$, $B[n-1]=1$, or $A[i]=0$, $B[i]=1$, $A[j]=B[j]$, $j>i$. In both cases the inequality A<B is valid, and output LT_LE of the comparator is the valid logic function $h\_n(U[0], U[1], V[1], \ldots, U[n-1], V[n-1])$.

Assume the logic implementation of the comparator includes an additional input LEQ, and that if LEQ=0, the comparator will operate as described above, whereas if LEQ=1, the circuit will produce a relation of strict inequality at output LT_LE. Hence, LT_LE=1 if and only if A=B. The output GT_GE is negation of LT_LE.

The function at output LT_LE is $$h\_\{n+1\}(LEQ, U[0], V[0], U[1], V[1], \ldots, U[n-1], V[n-1]),$$

where $U[i] = \neg A[i] \& B[i]$, $V[i] = \neg A[i] \vee B[i]$, $0 \leq i \leq n-i$.

If LEQ=0, the following equality is valid $$h\_\{n+1\}(LEQ, U[0], V[0], U[1], V[1], \ldots, U[n-1], V[n-1] =$$
$$U[n-1] \vee V[n-1] \& U[n-2] \vee V[n-1] \& V[n-2] \& U[n-3] \vee$$
$$\ldots \vee V[n-1] \& V[n-2] \& \ldots \& V[1] \&$$
$$U[0] \vee V[n-1] \& V[n-2] \& \ldots \& V[1] \& V[0] \& LEQ =$$
$$U[n-1] \vee V[n-1] \& U[n-2] \vee V[n-1] \& V[n-2] \&$$
$$U[n-3] \vee \ldots \vee V[n-1] \& V[n-2] \&$$
$$\ldots \& V(1] \& U[0] = h\_n\_U[0],$$
$$V[0], U[1], V[1], \ldots, U[n-1], V[n-1]).$$

If LEQ=1 the following equality is valid $$h\_\{n+1\}(LEQ, U[0], V[0], U[1], V[1], \ldots, U[n-1],$$
$$V[n-1] = U[n-1] \vee V[n-1] \& U[n-2] \vee [n-1] \& V[n-2] \&$$
$$U[n-3] \vee \ldots \vee V[n-1] \& V[n-2] \& \ldots \& V[1] \& U[0] \vee V[n-$$
$$1] \& V[n-2] \& \ldots \& V[1] \& V[0] \&$$
$$LEQ = U[n-1] \vee V[n-1] \& U[n-2] \vee V[n-1] \&$$
$$V[n-2] \& U[n-3] \vee \ldots \vee V[n-1] \&$$
$$V[n-2] \& \ldots \& V(1] \& V[0] =$$
$$h\_n(U[0], V[0], U[1], V[1], \ldots, U[n-1], V[n-1]) \vee$$
$$V[n-1] \& V[n-2] \&$$
$$\ldots \& V[1] \& V[0] = h\_n \vee v\_n.$$

Because LT_LE=1 if and only if A=B, if LEQ=1, the equality $h\_\{n+1\}(LEQ, U(0], V[0], U[1], V[1], \ldots, U[n-1], V[n-1])=1$ is equivalent to the equality $h\_n \vee v\_n=1$. Therefore, $h\_n \vee v\_n=1$ is equivalent to A=B.

Irrespective of V[i], from the equality V[i]=1 follows the inequality $A[i]=B[i]$, $0 \leq i \leq n-1$. If the equality $v\_\{n\}=V[n-1] \& V[n-2] \& \ldots \& V[0]=1$, is valid, A=B. Inversely, irrespective of V[i], if A=B, $v\_n=V[n-1] \& V[n-2] \& \ldots \& V[0]=1$ is a valid equality.

$h\_n=1$ only if A<B. While $h\_n \vee v\_n=1$ gives no strict inequality $A \leq B$, if A<B, $h\_n=1$. If A=B, $v\_n=1$. So in all cases, the inequality $A \leq B$ gives $h\_n \vee v\_n=1$.

The logic circuit of a comparator can be examined for both unsigned and signed numbers. Such a comparator has an additional input TC. If TC=0, the comparator compares unsigned numbers; if TC=1, the comparator compares signed numbers. Assume that the sign bit of number A is digit A[n-1]. According to the well-accepted representation of signed numbers, number A is considered as non-negative if the sign bit is zero. Therefore, $$\sum_{i=0}^{n-1} 2^i A[i] = \sum_{i=0}^{n-2} 2^i A[i].$$

If A[n−1]=1, the number A is considered as negative and equal to $$\sum_{i=0}^{n-1} 2^i A[i] - 2^n = \sum_{i=0}^{n-2} 2^i A[i] - 2^{n-1}.$$

Comparing signed numbers A and B, if A[n−1]=B[n−1]=0, both A and B are nonnegative and it is possible to perform their comparison by considering that both are unsigned, that is LT_LE=h_{n+1}(LEQ, U[0], V[0], U[1], V[1], . . . , U[n−1], V[n−1])=1, where U[i]=¬A[i]&B[i], V[i]=¬A[i]∨B[i] and 0≦i=n−1.

If A(n−1]=B(n−1]=1, both A and B are negative and it is possible to compare the numbers as unsigned numbers, that is LT_LE=h_{n+1}(LEQ, U[0], V[0], U[1], V[1], . . . , U[n−1], V[n−1])=1.

If A[n−1]=1 and B[n−1]=0, A is negative and B is nonnegative. Therefore A<B and LT_LE=1 irrespective of the value of LEQ. If A[n−1]=0 and B[n−1]=1, A>B and LT_LE=0 irrespective of value of LEQ.

Comparing unsigned numbers A and B, if A[n−1]=1 and B[n−1]=0, A>B and LT_LE=0 no matter what the value of LEQ. Similarly if A[n−1]=0 and B[n−1=1, A<B and LT_LE=1 irrespective of the value of LEQ. Therefore, the values of LT_LE will be negation of each other for A>B and A<B regardless of whether signed or unsigned numbers are compared. Stated another way, the value of LT_LE for A>B will be a negation of the value of LT_LE for A<B, regardless of whether the numbers are signed or unsigned.

If the sign bits A[n−1] and B[n−1] of numbers A and B are swapped, the comparison results will be opposite. For example, if the sign bits are A[n−1]=1 and B[n−1]=0, A<B and LT_LE=1. If the bit values are swapped so that A[n−1]=0 and B[n−1]=1, LT_LE=0. Note however that if A[n−1]=B[n−1], swapping of values of A[n−1] and B[n−1] will not change the value of LT_LE. Instead, LT_LE will remain equal to 0 whether A[n−1]=B[n−1]=0 or 1.

Generally if A[n−1]=1 and B[n−1]=0, or if A[n−1]=0 and B[n−1]=1, the result of comparison of signed numbers is opposite to the result of comparison the same numbers when considered as unsigned numbers. Therefore for comparing signed numbers A and B, it is possible simply to swap their sign bits and to compare the resulting numbers as unsigned numbers. To achieve this effect, it is possible to take unsigned numbers and to make then signed numbers by the following modifications: input A[n−1], B[n−1] and TC to XOR elements so that the output functions are A[n−1]⊕TC and B(n−1]⊕TC. These outputs are input to the V[n−1] and V[n−1] elements. As a result, instead of U[n−1] and V[n−1], the output functions are (A[n−1]⊕TC)&(B[n−1]⊕TC) and (A(n−1]⊕TC)∨(B[n−1]⊕TC). If TC=0, these outputs will be the same as the old values, which are equal to U[n−1]A[n−1]&B[n−1] and V[n−1]=¬A[n−1]∨B[n−1]. If TC=1, these outputs will equal U[n−1]=B[n−1]&A[n−1] and V[n−1]=_B[n−1]∨A[n−1], that is, the outputs will be received by the permutation of inputs A[n−1] and B[n−1].

Therefore if TC=0, the circuit will work as in the case of unsigned numbers. If TC=1 the circuit will operate on the permutation of inputs A[n−1], B[n−1]. Instead of using two XOR elements for this purpose, it is also possible to apply two multiplexers.

If V[n−i] is implemented using XNOR(A[n−1], B[n−1]), the function is symmetrical, therefore it can be kept without any modification. Therefore, the above mentioned transformation is only applied to function U[n−1].

2. Implementing a Comparator

Figure 1B:
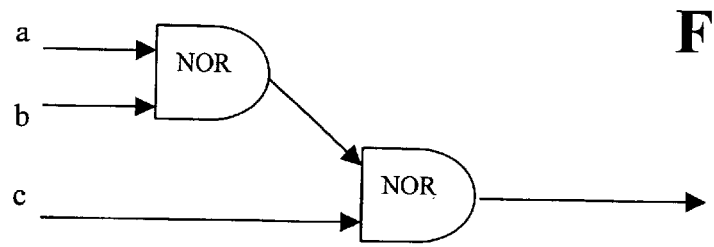
Figure 1C:
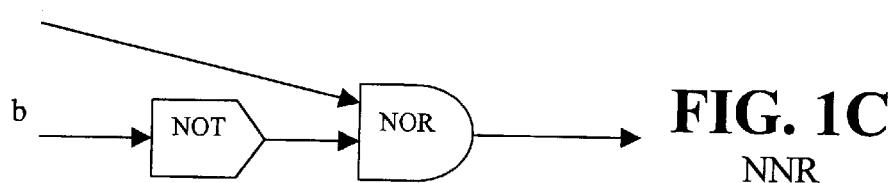
Figure 1D:
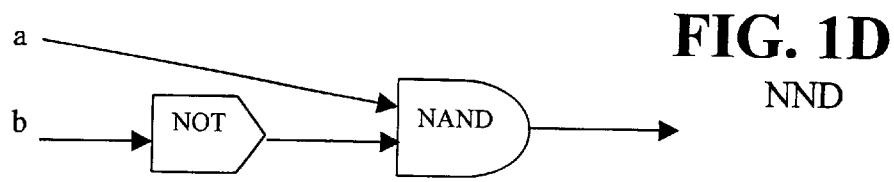
Figure 1E:
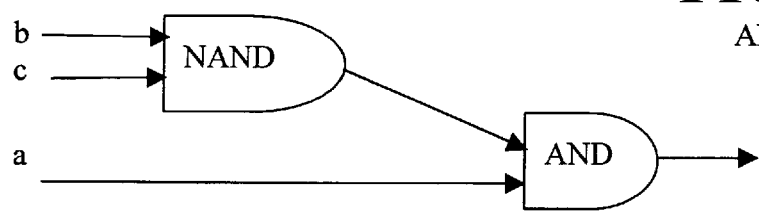
Figure 1F:
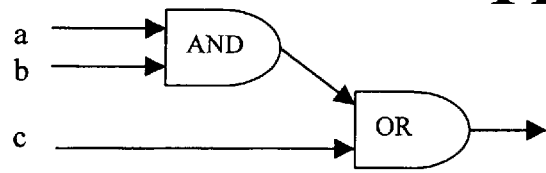
Figure 1G:
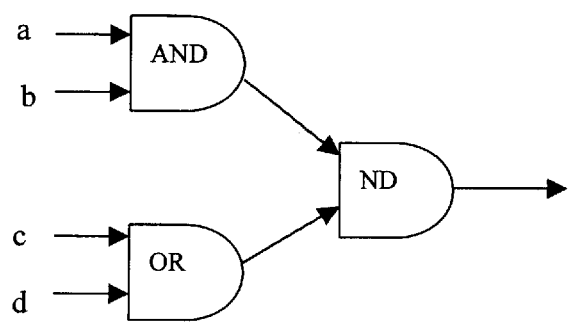
Figure 1H:
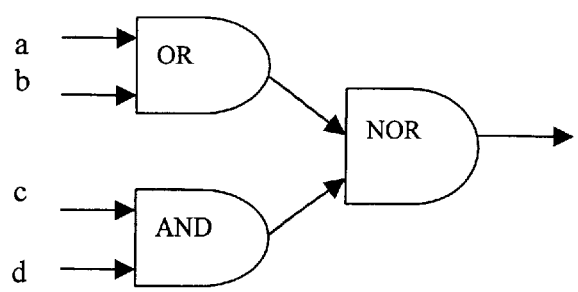

As used herein, a NDND element is a 3-input element, represented in FIG. 1A as two 2-input NAND elements and performing the function NDND(a,b,c)=NAND(a, NAND(b, c)), a NRNR element is a 3-input element, represented in FIG. 1B as two 2-input NOR elements and performing the function NDND(a,b,c)=NOR(a,NOR(b,c)), a NNR element is a 2-input element, represented in FIG. 1C as a 1-input NOT element (inverter) and a 2-input NOR element and performing the function NNR(a,b)=NOR(a,NOT(b)), a NND element is a 2-input element, represented in FIG. 1D as a 1-input NOT element (inverter) and a 2-input NAND elements and performing the function NND(a,b)=NAND(a, NOT(b)), a ANDND element is a 3-input element, represented in FIG. 1E as a 2-input NAND element and a 2-input AND element and performing the function ANDND(a,b,c)=AND(a,NAND(b,c)), a AO21 element is a 3-input element, represented in FIG. 1F as a 2-input AND element and a 2-input OR element and performing the function AO21)a,b,c)=OR(c,AND(a,b)), a AO3 element is a 4-input element, represented in FIG. 1G as a 2-input NAND element, a 2-input AND element and a 2-input OR element and performing the function AO3(a,b,c,d)=NAND(AND(a,b), OR(c,d))=NOR(AND(a,b), AND(c,d)), and a AO1 element is a 4-input element, represented in FIG. 1H as a 2-input NOR element, a 2-input AND element and a 2-input OR element and performing the function AO1(a,b,c,d)=NOR(OR(a,b) AND(c,d))=NOR(AND(a,b),c,d).

Figure 2A:
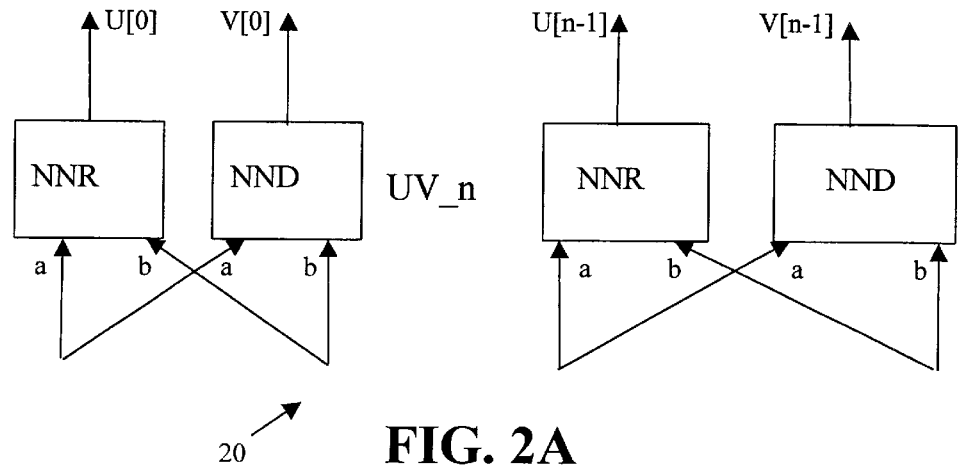
FIGS. 2A and 2B are logic circuit representations of a Boolean comparator useful in explaining aspects of the present invention.

A comparator is created as a superposition of two circuits 20 and 22. The first circuit 20 is illustrated in FIG. 2A and has inputs A[0:n−1], B[0:n−1], LEQ, TC and outputs U[0:n−1], V[0:n−1], and Sel. The U[n−1] and V[n−1] outputs provide the functions $$U[n-1] = XNOR(A[n-1], TC) \,\&\, XOR(B[n-1], TC)$$
$$= AND(XNOR(A[n-1], TC), XOR(B[n-1], TC)),$$
$$V[n-1] = XNOR(A[n-i], B[n-1]),$$
$$U[i] = \neg A[i] \,\&\, B[i] = AND(NOT(A[i]), B[i])$$
$$= NOR(A[i], NOT(B[i])) = NNR(A[i], B[i]),$$
$$V[i] = \neg A[i] \lor B[i] = OR(NOT(A[i]), B[i]) = NAND(A[i], NOT(B[i]))$$
$$= NND(A[i], B[i]),$$

for 0≦i≦n−1, where Sel=LEQ.

Figure 2B:
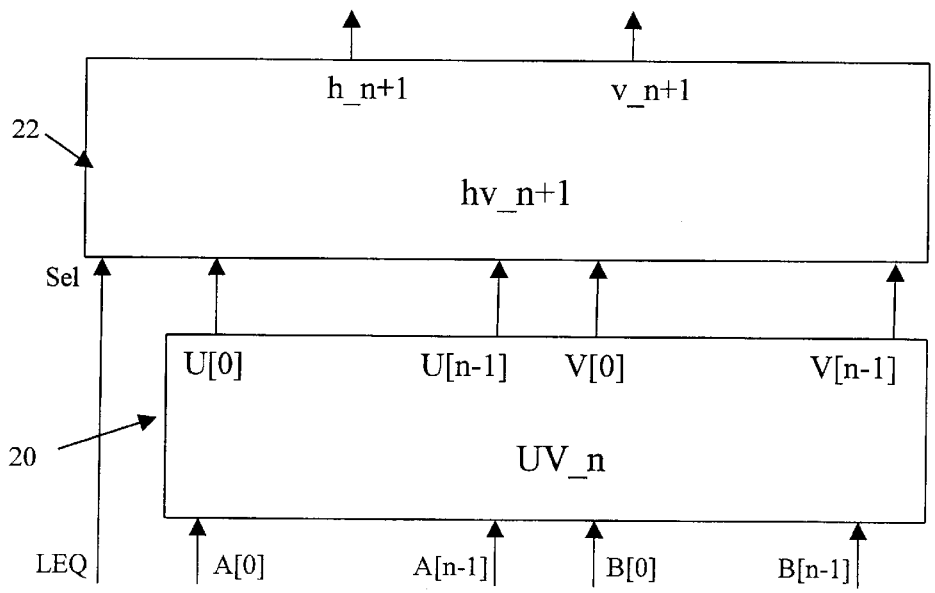

The second circuit 22, shown connected to the first circuit 10 in FIG. 2B, contains inputs U[0:n−1], V[0:n−1], Sel from the first circuit and outputs LT_LE, GE_GT. The function LT_LE is equal to h_{n+1}(Sel, U[0], V[0], U[1], V[1], . . . , U[n−1], V[n−1]), and the function GE_GT is the negation of LT_LE. Therefore the task of minimizing the depth (and hence delay) of the comparator becomes one of minimizing the depth of function h_{n+1}. For brevity, n replaces n+1in the following. It is known that $$h\_n(U[0], U[1], V[1], \ldots, U[n-1], V[n-1]) = h'\_k \vee v'\_k \& h\_\{n-k\},$$

$$h'\_k = h\_k(U[n-k], U[n-k+1], V[n-k+1], \ldots, U[n-1], V[n-1]),$$

$$h\_\{n-k\} = h\_\{n-k\}(U[0], U[1], V[1], \ldots, U[n-k-1], V[n-k-1]),$$

$$v'\_k = V[n-k] \& \ldots \& V[n-1],$$

$$v[n] = V[0] \& \ldots \& V[n-1] = v'\_k \& v\_\{n-k\}.$$

These expressions can also be presented as $h\_n = \text{nand}(\neg h'\_k, \text{nand}(v'\_k, h\_{\{n-k\}})),$
$v\_n = \text{nor}(\neg v'\_k, \neg v\_\{n-k\}),$
$\neg h\_n = \text{nor}(h'\_k, \text{nor}(\neg V'\_k, \neg h\_\{n-k\})),$
$\neg v\_n = \text{nand}(v'\_k, v\_\{n-k\}).$ Using these expressions, it is possible to calculate the function $h\_n$ as though placing brackets in a product n of multiplicands. For example, the expression for $h\_n$ becomes $h\_n = R(U[n-1], V[n-1], R(U[n-2], V[n-2], \ldots, R(U[1], V[1], V(0)) \ldots),$ where $R(z,y,z) = \text{nand} \neg x, \text{nand}(y,z))$. This expression represents a well known ripple circuit, and has minimum complexity, but large depth and delay. Using the recursive expansion $h\_n = h\_k \vee v\_k \, h\_\{n-k\},$
$v\_n = v\_k \& v\_\{n-k\}$ if $k = \lceil n/2 \rceil$, the circuit depth is $2 \log\_2 n + O(1)$ and complexity $3n - O(\log\_2 n)$. This is a standard implementation, known as a dichotomizing comparator.

Figure 6:
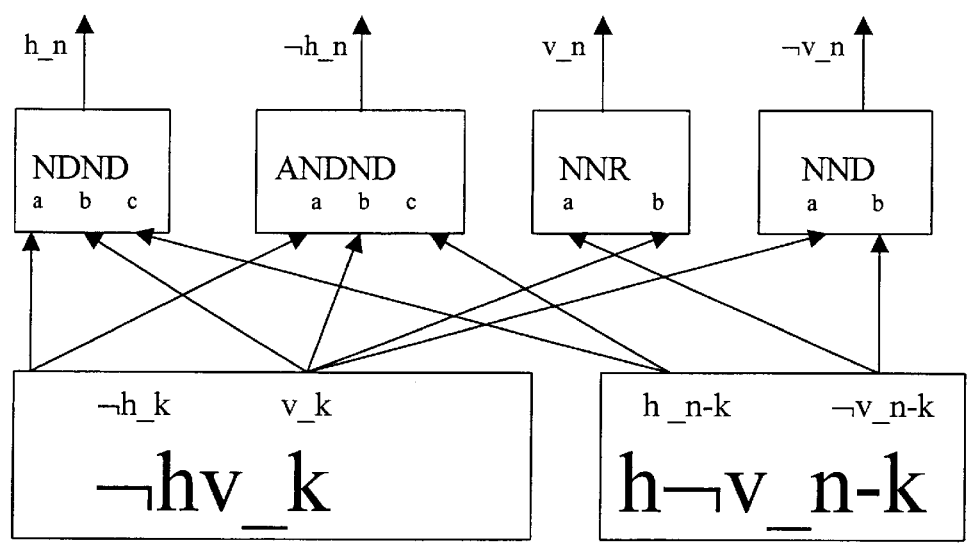

Examples of these circuits are illustrated in FIGS. 3–7 where FIGS. 3A and 3B illustrate recursive construction of modules $\neg hv\_n$ and $h\neg v\_n$, respectively, for a comparator, FIG. 4 illustrates the last step of recursive construction of module $hv\_n$ of a 2-output comparator, FIG. 5 illustrates the last step of recursive construction of a 2-output comparator using a GP module, FIG. 6 illustrates the last step of recursive construction of a 4-output comparator and FIG. 7 illustrates recursive construction of the $HV4\_n$ main module of a 4-output comparator.

3. Fibonacci Comparator

In the present invention, a comparator architecture is based on a Fibonacci series. The resulting comparator is herein referred to as a Fibonacci circuit or Fibonacci comparator. The architecture is based on recursive expansion of the Boolean function $$h\_n = h\_n(U[0], U[1], V[1], \ldots, U[n-1], V[n-1])$$

$$= \text{OR}(U[n-1], \text{AND }(V[n-1], U[n-2]), \ldots,$$

$$\text{AND }(V[n-1], \ldots, V[1], U[0])), \text{ and}$$

$$v\_n = v\_n(V[0], \ldots, V[n-1])$$

$$= \text{AND}(V[0], \ldots, V[n-1])$$

in the form $h\_n = \text{OR}(h\_k, \text{AND}(v\_k, h\_\{n-k\})),$
$v\_n = \text{AND}(v\_k, v\_\{n-k\}),$ where parameter k is chosen in the closed interval from $F\_i$ to $n - F\_\{i-1\} = F\_i$, and where $F\_i$ is a member chosen from a Fibonacci series. The depth of the Fibonacci circuit is less than the depth of standard circuit when n is greater than about 8.

The first level of the comparator circuit with inputs $[n-1:0]A$ and $[n-1:0]B$ produces function $V[i] = \text{OR}(\text{NOT}(A[i]), B[i])$, and is used in place of standard function $V[i] = \text{XNOR}(A[i]), B[i])$. The reason for this is that the OR element has a smaller delay than the XNOR element, resulting in reduced delay for the comparator. The circuit employs NOR and NAND elements instead of monotone OR and AND elements of standard circuits, resulting in smaller delays without changing the topology of the circuit.

The delay of the Fibonacci circuit is minimized by varying parameter k on each recursive step in the expansions of $h\_n$ and $v\_n$. The delay is further minimized by the distribution of negations over the elements of the circuit.

In the present invention, the function $V\_i = \neg A[i] \vee B[i]$ is used to employ circuit elements with smaller delay. The circuits of FIGS. 3–7 can be obtained with smaller depth if k is selected based on $k = F\_l$ and $n - k = F\_\{l-1\}$ where l satisfies $F\_l < n = F\_\{l+1\}$ and the sequence $F\_l$ is the sequence of numbers the Fibonacci series that is defined recursively by the equality $F\_\{l+1\} = F\_\{l\} + F\_\{l-1\}$ with the initial conditions $F\_1 = 1$ and $F\_0 = 0$. When n is equal to the Fibonacci number, k can be determined uniquely. For the remaining cases, k belongs to the series of natural numbers $[n - F\_\{l-1\}, F\_l]$ and can be arbitrarily selected from this series.

Figure 8A:
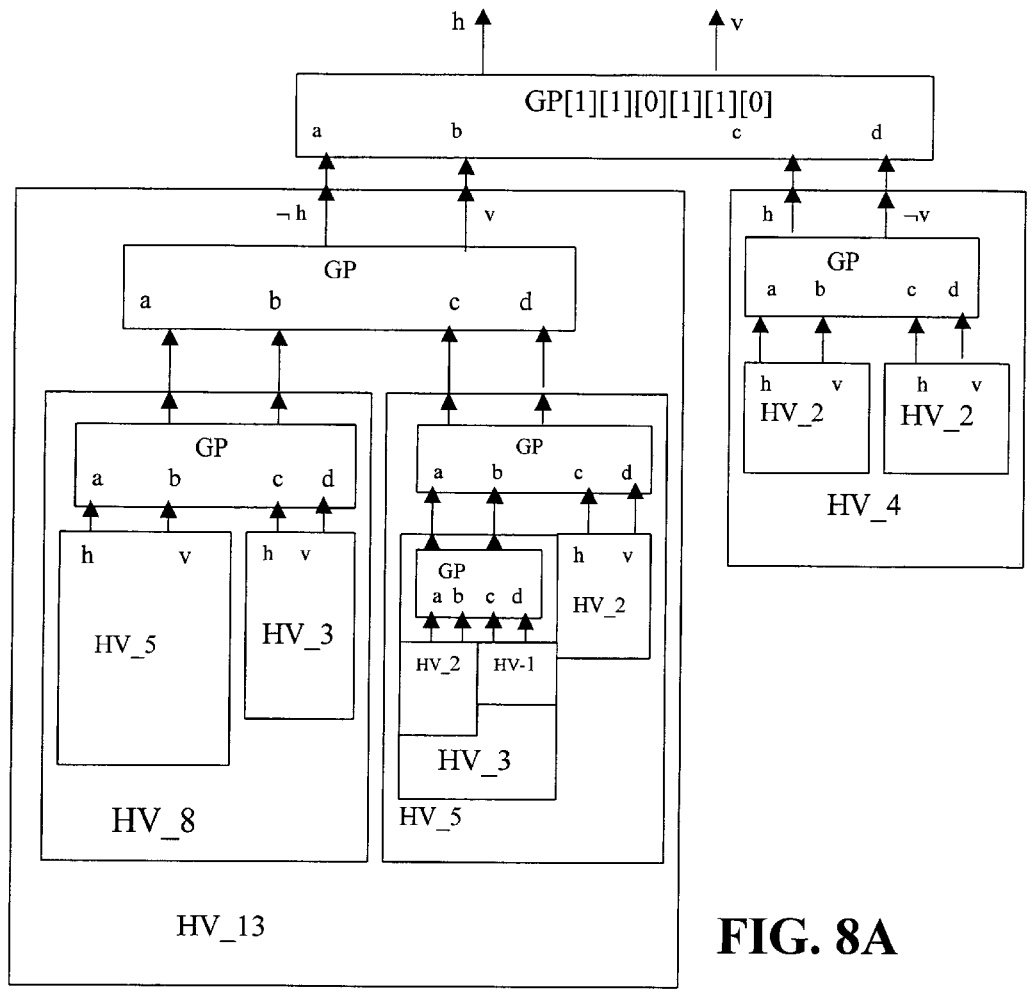
FIGS. 8A, 9, 10, together with subcircuits illustrated in FIGS. 8B and 8C, illustrate embodiments of Fibonacci comparator circuits in accordance with the present invention.
Figure 8B:
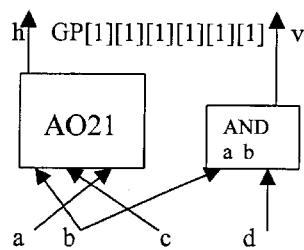
Figure 8C:
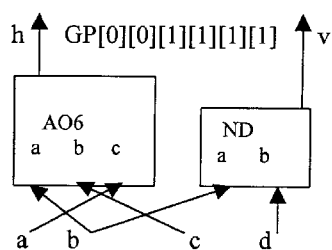
Figure 9:
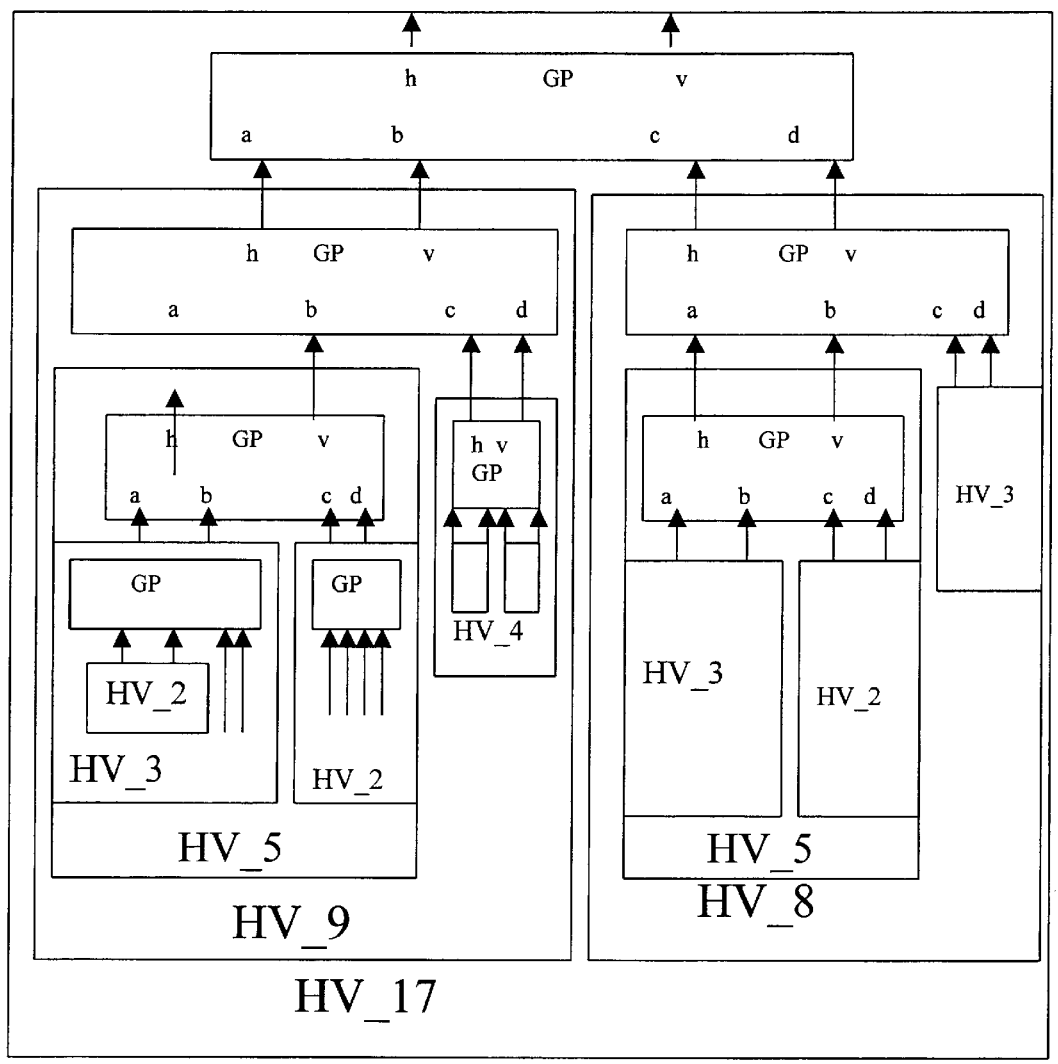
Figure 10:
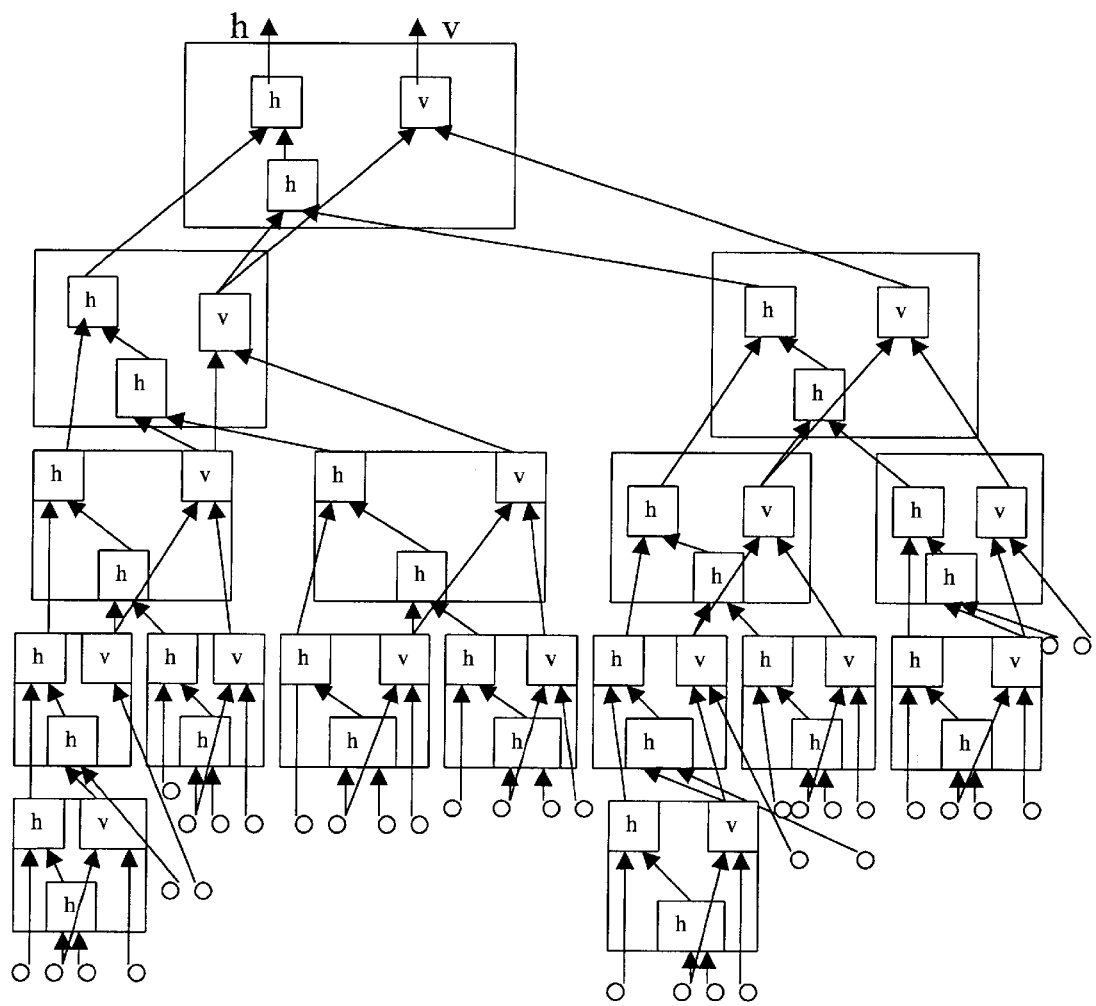

If the parameter k is selected as the right extremity of a section (greatest allowable value), the circuit is a right-side circuit, as illustrated in FIG. 8A, with examples of GP modules being illustrated in FIGS. 8B and 8C. If k is selected as the left extremity of the section (least allowable value), the a circuit is a left-side circuit, as illustrated in FIG. 9. FIG. 10 illustrates another left-side circuit forming a 16-bit 2-output comparator employing two input elements. The following recursive evaluations for area and depth can be obtained:

$L(n) = L(k) + L(n-k) + 3,$
$D(h\_n) = 1 + \max(D(h\_k), 1 + \max(D(v\_k), D(h\_\{n-k\}))),$
$D(v\_n) = 1 + \max(D(v\_k), D(v\_\{n-k\})).$ Applying these evaluations and also taking into account $n - k = F\_\{l+1\} - F\_\{l\} = F\_\{l-1\}$, the following equalities result $$D(v\_n) = 1 + \max(D(v\_k), D(v\_\{n-k\}))$$
$$= 1 + \max(l - 2, l - 3)$$
$$= l - 1,$$
$$D(h - n) = 1 + \max(D(h\_k), 1 + \max(D(v\_k), D(h\_\{n-k\})))$$
$$= 1 + \max(l - 1, 1 + l - 2) = l,$$
$$L(n) = L(k) + L(n-k) + 3 = 3(k-1) + 3(n-k-1) + 3$$
$$= 3(n-1),$$

on the condition that $k = F\_\_{l < n = F\_\_}\{l+1\}$, as in the cases of the circuits illustrated in FIGS. 8A, 9 and 10.

The inequalities follow from the valuations $D(h\_n) = l - 1$, if $F\_\{l-1\} < n = F\_l$. For this computation, function $h\_n$ does not calculate all conjunctions $v\_n$. Therefore, the evaluation of the complexity of this function decreases to $3n - 2 - \lceil \frac{1}{2} \rceil$. The result is a circuit with depth of l and complexity of $3n - 2 - \lceil \frac{1}{2} \rceil$. (It is also possible to estimate the depth using the following formula:

$$D(h_n) \le \left[\left[\log\sqrt{5\left(n-\frac{1}{2}\right)}\right]\right]/(\log\varphi], \varphi = \frac{\sqrt{5}+1}{2}.$$

Generally speaking, it is possible to create the circuit with the depth $D(h_n) \le (\log n) + (1+\epsilon_n)\sqrt{2 \log n}$, using a more complicated theoretical method, where log is a binary logarithm, and $\epsilon_n$ approaches zero. However the depth of such a circuit will be less than the depth of the preferred circuit only if $n \ge 256$).

4. Distribution of Negations in Comparator

For brevity symbol f^σ designates the function f or its negation depending on whether a σ=1 or 0. A circuit with two outputs that realizes functions h^α__n and v^β__n may be defined as h^αv^β, where α=0,1 and β=0,1.

GP[α_1][α_2][β_1][β_2][β_3][β_4] designates a module with two outputs h and v and four inputs a, b, c, d, realizing functions AO21^{α_1}(b^{β_2}, c^{β_3}, a^{β_1}), AND^{α_2}(b^{β_2}, and d^{β_4})), where AO21(a,b,c)=OR(AND(a,b),c) (FIG. 1F). For each of 64 modules, the optimal implementation is selected based on area or delay. For example, the module GP[0][0][1][1][1][1] will consist of elements AO6 and NAND, where AO6(a,b,c)=NOR(AND(a,b),c). Examples of this module are illustrated in FIGS. 4 and 8A.

Similarly, AO(a^{β_1}, b^{β_2}, c^{β_3}) designates a module with two outputs h and ¬h and three inputs a, b, c, realizing functions AO21^{1}(a^{β_1}, b^{β_2}, c^{β_3}), AO21^{0}(a^{β_1}, b^{β_2}, c^{β_2}, (^{β_3}). For each of such 8 modules, the optimal implementation is again selected based on area or delay. For example, a module AO[1][1][1] consists of elements AO21(a,b,c)=OR(AND(a,b),c), AO6(a,b,c)=NOR(AND(a,b),c).

Operation $h_{13}$ n =NDND(¬hv_{k}, $h_{13}$ {n-k}) is a special case of the general operation h¬h__n=AO[β_1 1][β_2][β_3](h^{β_2}v{β_3}_k,h^{β_1}_{n-k}), and is obtained for the case [β_1][β_2][β_3]=[1][0][1]. Applying the dynamic programming algorithm in the recursive constructions of modules h^αv^β__n and h¬v__n at each step, it is possible to optimally select one from 64 (accordingly 8) operations. This optimizes the distribution of negations in the circuit without changing its topology.

The negation distribution process is as follows: For each module h^{α_1}v^{α_2}_n, the two-dimensional vectors are comparable to the delays of outputs h and v. The vector is one of 16 operations of the recursive construction of the module h^{α_1}v^{α_2}_n=
GP[α_1][α_2][β_1][β_2][β_3][β_4](h^{β_1}v^{β_2}_k,
h^{_3}v^{β_4}_{n-k}), from modules h^{β_1}v^{β_2}_k and h^{β_3}v^{β_4}_{n-k}. This corresponds to the operation of calculation of the delay vectors of module h^{α_1}v^{α_2}_n on the previously calculated delay vectors of modules h^{β_1}v^{β_2}_k and h^{β_3}v^{β_4}_{n-k}. This operation is monotone in the sense that neither component of the resultant vector decreases.

The indicated property of monotonicity allows the delay vectors to be recursively minimized for comparison of vectors. A first vector is not smaller than a second vector if each component in the first vector is not less than the corresponding component of the second vector. However such operations for any set of vectors will not always give one minimum vector. Instead, sets of pair-wise components may be found that are not comparable with one another, in which case the components are not from vectors of the considered set. Therefore each step of the dynamic algorithm obtains a set of minimum vectors. The last step will provide the set of minimum delay vectors of outputs h__n, ¬h__n. The norm of each vector is the maximum of its components. It is necessary to select a vector with a minimum norm from the set of vectors.

5. Six Output Comparator

Consider a comparator having outputs LT, GE, LE, GT, EQ, and NE. For this comparator there is no switching input LEQ. To realize all outputs it is necessary to use functions V[i]=A[i]⊕B[i]=XNOR(A[i], B[i]). Output LT will realize function h__n(U[0], U[1], V[1], ..., U[n-1], V[n-1]), output GE will realize its negation ¬h__n, output LE will realize function h__nvv__n, output GT will realize its negation NOR(h__n, v__n), output EQ will realize function v__n, and output NE will realize its negation ¬v__n. v__n represents the conjunction V[n-1]&V[n-2]& ... &V[0]. Thus it is possible to realize all six outputs using two inverters, an OR gate and an NOR gate with depth increased by 1 when compared with the circuit hv__n. It is also possible to implement the circuit without inverters if hv__n uses two more elements at the last step of the recursive construction to realize all four functions h__n, ¬h__n, v__n and ¬v__n.

If n is not a Fibonacci number (among powers of 2, only 8 is equal to the Fibonacci number), it is possible to realize all 6 functions h__n, ¬h__n, v__n, ¬v__n, h__nvv__n and ¬(h__nvv__n) with the same depth as one function h__n.

As indicated above, h__nvv__n h__{n+1}(1,U[0],V[0],U[1],V[1], ..., U[n-1], V[n-1]). Therefore circuit hhv__{n} is recursively constructed to realize functions h_n = h_n(U[0], U[1], V[1], ..., U[n-1], V[n-1]), v_n = V[n-1] & V[n-2] & ... & V[0], and the function h_n v v_n = h_{n+1}(1, U[0], V[0], U[1], V[1], ..., U[n-1], V[n-1]).

A circuit hhv__n, shown in FIGS. 11A and 11B, is created similar to circuit hv__n using the recursive expansions, h__n=h__kvv__k h__{n-k},
v__n=v__k&v__{n=k},
h__nvv__n=h__$_k$vv__k(h__{n-k}vv__{n-k}).

Using h__nvv__n=h__{n+1}(1,U[0],V[0],U[1],V[1], ..., U[n-1],V[n-1]) to choose parameters that are appropriate for the Fibonacci design, n+1 will be taken instead of n (as was done in the comparator construction with two outputs and input LEQ, so that this comparator and the above mentioned comparator with six outputs have identical depth).

In this construction the depth of circuit hhv__2 increases by 1 compared with the depth of circuit hv__2, but the depth of circuit hhv__3 is equal the depth of circuit hv__3 because the functions h__3vv__3=h__2vv__2&(h__1vv__1) and h__3=h__2vv__2&h__1 have equal depth 3. Therefore the depth of the function h__5vv__5=h__3vv__3&(h__2vh₁) is greater than the depth of function h__5=h__3vv__3&h__2, but the depth of function h__8vv__8=h__5vv__5&(h__2vv)2) is equal to the depth of function h__8=h$_{13}$5vv__5&h__3. Therefore for n=F__4, F__6, F__8, ... the depth of function h__n is equal the depth of function h__nvv__n, and for n=F__3, F__5,F__7, . . . the depth of function h__n is less than the depth of h__nvv__n. This fact is valid for circuits hhv__n and hv__n. Similarly, a circuit may be constructed with the same depth which realizes all six functions h__n, ¬h__n, v__n, ¬v__n, h__nvv__n, and ¬(h__nvv__n). The distribution of negations may then be optimized as described in section 4.

If there are no restrictions on the area of a circuit, it is possible to use the function h__nvv__n=h__{n+1}{1,U[0],V[0],U[1],V[1], . . . , U[n=1],V[n−1]

to realize parallel functions h__n and v__n (FIG. 11B) The depth will be same, but the. area will be increased, but by no more than double. The delay of the circuit may be less, because it has the smaller sum of fanout of elements on paths from inputs to outputs.

It is also possible to upgrade the comparator with six outputs by adding an input TC so that it can compare both signed and unsigned numbers. The above described optimized method of distribution of negations may then be applied to the six-output comparator as well.

6. Four Input Fibonacci Comparator

Figure 12A:
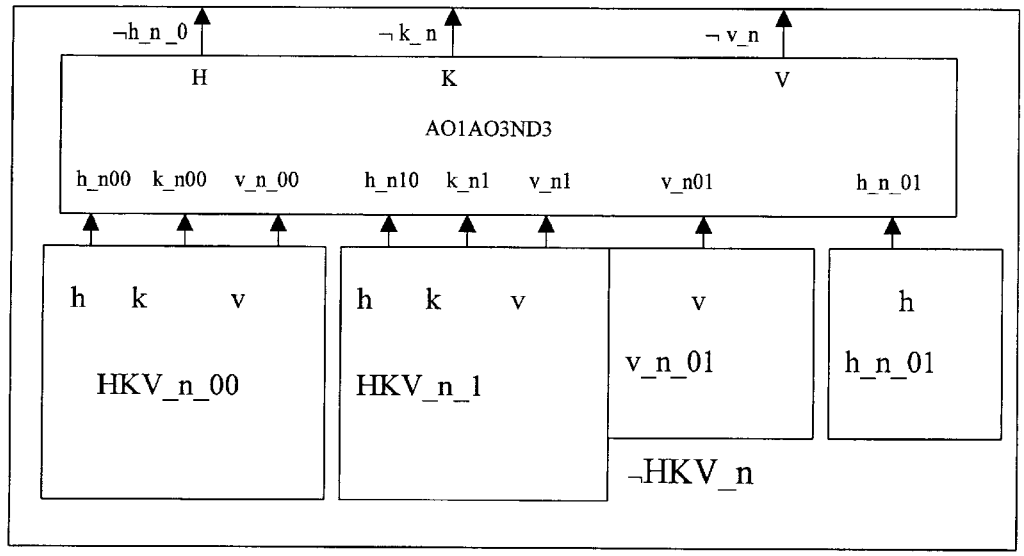
FIGS. 12A, 12B, 13A, 13B, 14A and 14B illustrate the construction of a 4-input comparator according to embodiments of the present invention.
Figure 12B:
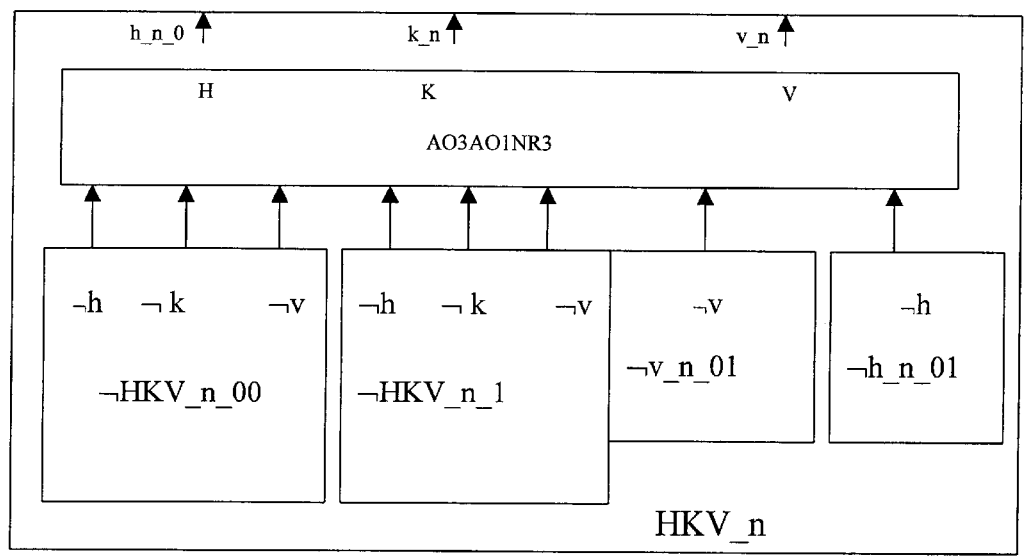
Figure 13A:
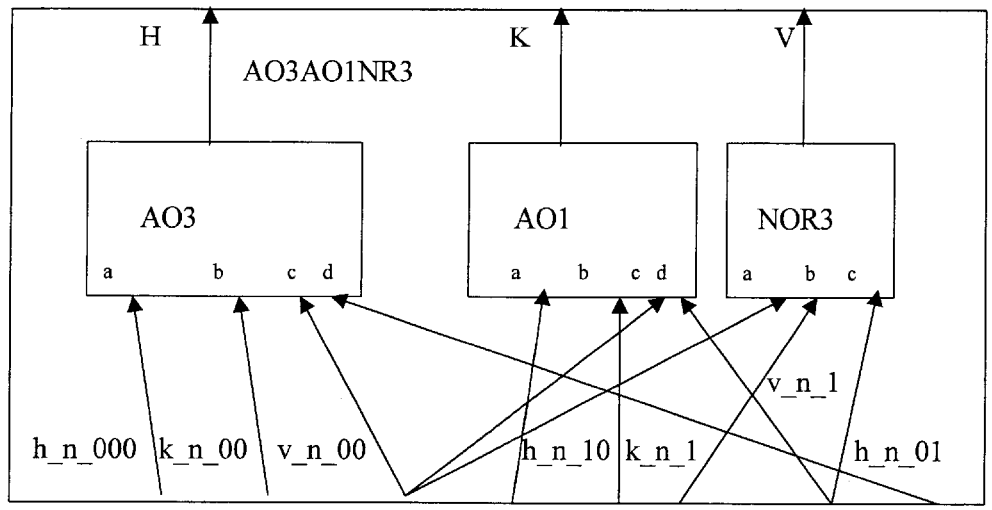

For purposes of discussion n__0 and n__1 are the brief entry of expansions h__n=h__{n__0}vv__{n__0}&h__{n__}, and k__n=v__{n__0}&h__{n__1}. HKV__n designates the circuit with inputs U[0:n−1] and V[1:n−1] that realizes functions h__{n__0}, k__n and v__n. This circuit can be recursively constructed as shown in FIG. 12B by connecting the outputs of subcircuit ¬HKV__{n__{00}} and ¬HKV__{n__1} to appropriate inputs of circuit AO3AO1NR3 illustrated in FIG. 13A (namely h__n__{000}, k__n__00, v__n__00, h__n__10, k__n__1 and v__n__1), by connecting the input v__n__01 to the subcircuit realizing the function ¬v__n__01, and by connecting the input h__n__01 to the subcircuit realizing the function ¬h__n__01. The circuit AO3AO1NR3 is described in Verilog code as follows:

Module AO3AO1NR3(H, K, V, h__n__000, k__n__00,
        v__n__00, h__n__10,
        k__n__1, v__n__1, v__n__01, h__n__01):
    Input h__n__000, k__n__00, v__n__00, h__n__10, k__n__1,
        v$_n$__1,
        v__n__01, h__n__01;
    Output H, K, V;
    AO3(.Z(H), .A(h__n__000), .B(k__n__00), .C(v__n__00),
        .D(h__n__01));
    AO1(.Z(K), .A(h__n__10), .B(k__n__1), C(v__n__00),
        .D(v__n__01));
    NOR3(.Z(V), .A(v__n__00), .B(v__n__01), .C(v__n__1));
    Endmodule As shown in FIG. 13A, circuit AO3AO1NR3 uses element AO3(a,b,c,d) (FIG. 1G) which performs the logic function NOR(AND(a,b,), AND(c,d)) and element AO1(a, b,c,d) (FIG. 1H) which performs the logic function NOR3 (AND(a,b),c,d), where NOR3(a,b,c)=NOR(a,NOR(b,c)).

Circuit ¬HKV__n differs from the circuit HKV__n in that all elements are replaced by logically dual elements, and circuit inputs are connected with corresponding inverters. Therefore its outputs realize the negations of corresponding outputs of circuit HKV__n. Circuit ¬HKV__n, shown in FIG. 12A, is created in the same way as from the subcircuits HKV__{n__{00}}, HKV__{n__{1}} and dual subcircuit AO3AO1NR3, but in this case the subcircuits realizing v__n__01 and h__n__01 are used instead subcircuits realizing ¬v__{n__{01}} and ¬h__{n__{01}}.

Figure 13B:
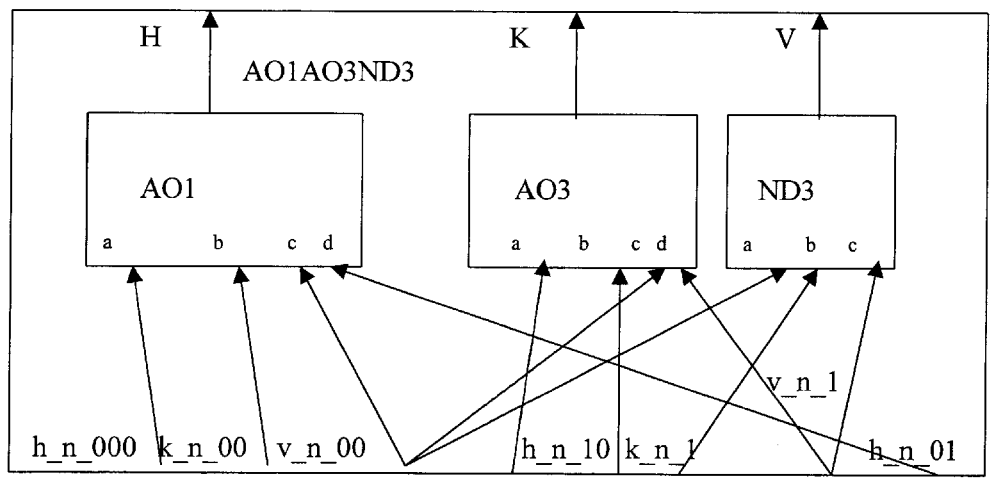
Figure 14A:
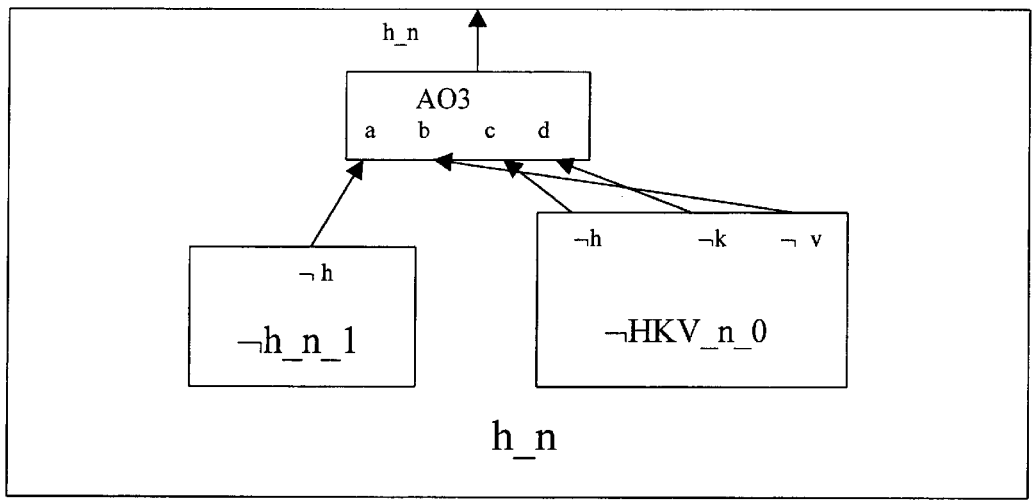

As shown in FIG. 14A, circuit h__n is recursively created by connecting outputs of subcircuits ¬HKV__{n__0}, ¬H__{n__1} to inputs of element AO3 accordingly to matching (h__0, C), (K, D), (V, B), (h__1, A) (see FIG. 13).

Figure 14B:
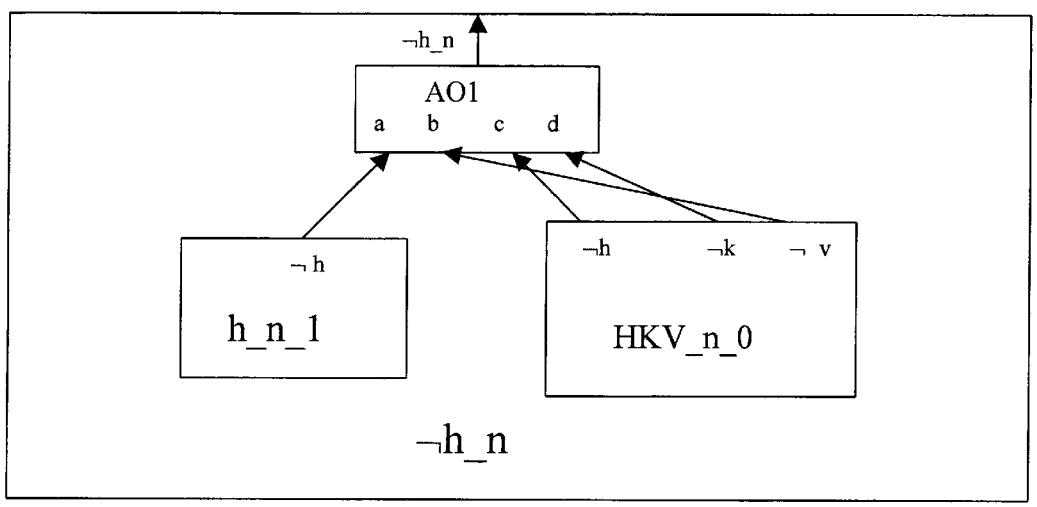

Circuit ¬h__n, shown in FIG. 14B, differs from circuit h__n in that all elements are replaced by dual elements and the circuit inputs are connected with corresponding inverters. Therefore its output is the negation of output of h__n. The circuit ¬h__n may be created in the same way from subcircuits HKV__{n__0}, h__{n__1}, and element AO1 (see FIG. 13).

Figure 15A:
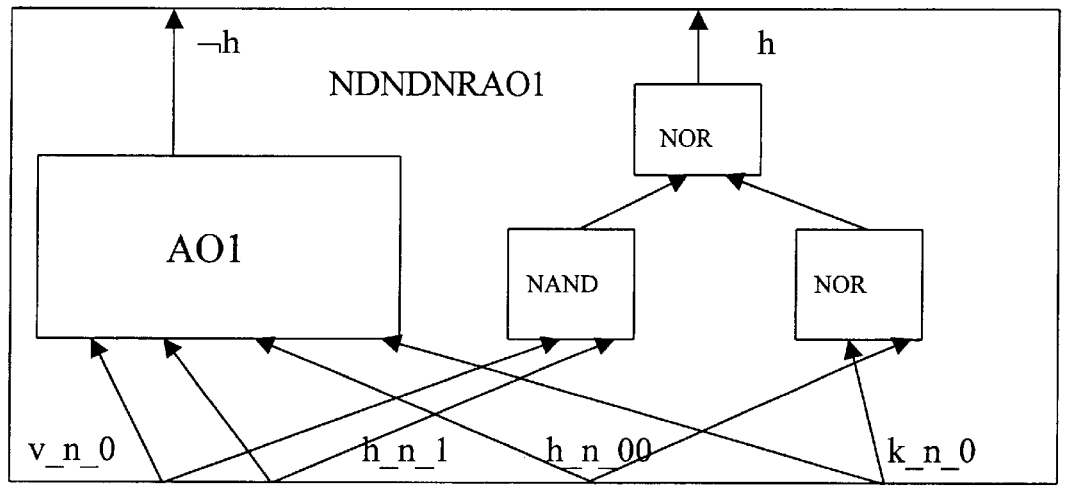
FIGS. 15A and 15B illustrate the construction of a 2-input comparator according to embodiments of the present invention.
Figure 15B:
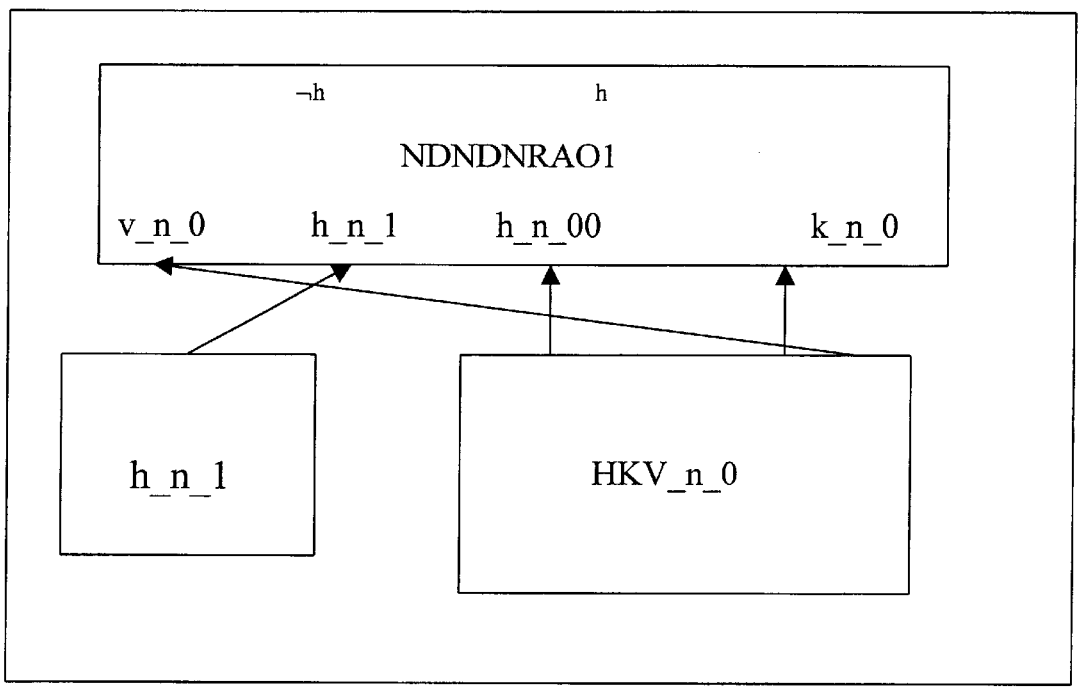

As shown in FIGS. 15A and 15B, the circuit of a 2-output comparator can be constructed by connecting outputs of subcircuits HKV__{n__0}, h__{n__1} to appropriate inputs of circuit NDNDNRAO1, as described in the following Verilog statement:

Module NDNDNRAO1(H, NH, h__n__00, k__n__0, v__n__0, h__n__1):
    Input h__n__00, k__n__0, v__n__0, h__n__1;
    Output H, NH;
    Wire wh, wk;
    NR2(.Z(wh), .A(h__n__00), .B(k__n__0));
    ND2(.Z(wk), .A(v__n__0), .B(h__n__1));
    ND2(.Z(H), .A(wh), .B(wk));
    AO1(.Z(NH), .A(v__n__0), .B(v__n__1), .C(h__n__00),
        .D(k__n__0));
    Endmodule This circuit uses element NR2(a,b) with logic function NOR(a,b) and element ND2(a,b) with logic function NAND (a,b).

The correctness of constructed circuit can be proved. The correctness of subcircuit HKV__{n} is proved simultaneously with the correctness of subcircuits ¬HKV__{n} by induction with the help of the identities $$\neg k\_n = \neg(v\_\{n\_0\} \& h\_\{n\_1\})$$

$$= \neg(v\_\{n\_00\} \& v\_\{n\_01\} \& (h\_\{n\_10\} \vee v\_\{n\_10\} \& h\_\{n\_11\}))$$

$$= \neg(v\_\{n\_00\} \& v\_\{n\_01\} \& (h\_\{n\_10\} \vee k\_\{n\_1\}))$$

$$= AO3(h\_\{n\_10\}, k\_(n\_1), v\_\{n\_00\}, v\_\{n\_01\}),$$

$$k\_n = \neg AO3(h\_\{n\_10\}, k\_\{n\_1\}, v\_\{n\_00\}, v\_\{n\_01\})$$

$$= AO1(\neg h\_\{n\_10\}, \neg k\_\{n\_1\}, \neg v\_\{n\_00\}, \neg v\_\{n\_01\}),$$

$$h\_\{n\_0\} = h\_\{n\_00\} \vee v\_\{n\_00\} \& h\_\{n\_01\}$$

$$= (h\_\{n\_000\} \vee v\_\{n\_000\} \& h\_\{n\_001\}) \vee v\_\{n\_00\} \& h\_\{n\_01\}$$

$$= h\_\{n\_000\} \vee k\_\{n\_00\} \vee (v\_\{n\_00\} \& h\_\{n\_01\})$$

$$= \neg(\neg h\_\{n\_000\} \& \neg k\_\{n\_00\} \& \neg(v\_\{n\_00\} \& h\_\{n\_01\}))$$

$$= NAND3(\neg h\_\{n\_000\}, \neg k\{n\_00\}, \neg v\_\{n\_000\} \vee \neg h\_\{n\_01\})$$

$$= AO3(\neg v\_\{n\_00\}, \neg h\_\{n\_01\}, \neg h\{n\_000\}, \neg k\_\{n\_00\}),$$

$$\neg h\_\{n\_0\} = \neg AO3(\neg v\_\{n\_00\}, \neg h\_\{n\_01\}, \neg h\_\{n\_000\},$$

-continued $$\neg k\_\{n\_\{00\}\}) = AOI(v\_\{n\_\{00\}\}, h\_\{n\_\{01\}\},$$
$$h\_\{n\_\{000\}\}, k\{n\_\{00\}\}),$$
$$\neg v\_n = NAND3(v\_\{n\_00\}, v\_\{n\_01\}, v\_\{n\_1\}),$$
$$v\_n = NOR3(\neg v\_\{n\_00\}, \neg v\_\{n\_\{01\}\}, \neg v\_\{n\_1\}),$$

where NAND3(a,b,c)=NAND(a,AND(b,c)) and NOR3(a,b,c)=NOR(a,OR(b,c)).

The correctness of subcircuit h_n is proved simultaneously with a correctness of sub-circuit ¬hd_n by induction with the help of identities $$h\_n = h\_\{n\_0\} \vee v\_\{n\_0\} \& h\_\{n\_1\}$$
$$= (h\_\{n\_00\} \vee v\_\{n\_00\} \& h\_\{n\_01\}) \vee v\_\{n\_0\} \& h\_\{n\_1\}$$
$$= h\_\{n\_00\} \vee k\_\{n\_0\} \vee (v\_\{n\_0\} \& h\_\{n\_1\})$$
$$= \neg(\neg h\_\{n\_00\} \& \neg k\_\{n\_0\} \& \neg (v\_\{n\_0\} \& h\_\{n\_1\}))$$
$$= NAND3(\neg h\_\{n\_00\}, \neg k\_\{n\_0\}, \neg v\_\{n\_0\} \vee \neg h\_\{n\_1\})$$
$$= AO3(\neg v\_\{n\_0\}, \neg h\_\{n\_1\}, \neg h\_\{n\_00\}, \neg k\_\{n\_0\}),$$
$$\neg h\_n = AO3(\neg v\_\{n\_0\}, \neg h\_\{n\_1\}, \neg h\_\{n\_00\}, \neg k\_\{n\_0\})$$
$$= AOI(v\_\{n\_0\}, h\_\{n\_1\}, h\_\{n\_00\}, k\_\{n\_0\}).$$

The correctness of the comparator is proved with the help of identities $$\neg h\_n = AOI(v\_\{n\_0\}, h\_\{n\_1\}, h\_\{n\_00\}, k\_\{n\_0\}),$$
$$NAND(NOR(h\_\{n\_00\}, k\_\{n\_0\}), NAND(v\_\{n\_0\},$$
$$h\_\{n\_1\})) = OR(OR(h\_\{n\_00\}, k\_\{n\_0\}), AND(v\_\{n\_0\}, h\_\{n\_1\}))$$
$$= OR2(OR2(h\_\{n\_00\}, v\_\{n\_00\} \& h\_\{n\_01\}),$$
$$AND2(v\_\{n\_0\}, h\_\{n\_1\}))$$
$$= OR2(h\_\{n\_0\}, AND2(v\_\{n\_0\}, h\_\{n\_1\}))$$
$$= h\_\{n\_0\} \vee v\_\{n\_0\} \& h\_\{n\_1\})) = h\_n.$$

As the basis of induction (n=1), consider the trivial circuit h_1 that has only one output directly connected to one input. The circuit ¬h_n consists of one inverter. For n=2, this circuit consists of one element AO7 with logical function AO7(a,b,c)=NAND(OR(a,b),c) because $$h\_2 = U[2] \vee V[2] \& U[1] = \neg(\neg U[2] \& \neg(V[2] \& U[1]))$$
$$= \neg(\neg U[2] \&(\neg V[2] \vee \neg U[1])) = NAND2(\neg U[2], OR$$
$$(\neg V[2], \neg U[1])) = AO7(\neg V[2], \neg U[1]), \neg U[2]).$$

If n=2, the circuit HKV_n will realize functions $$h\_1 = U[1],$$
$$k\_2 = V[1] \& U[0] = NOR(\neg V[1], \neg U[0]),$$
$$v\_2 = V[1] \& V[0] = NOR(\neg V[1], \neg V[0]).$$

If n=3, the circuit HKV_n will have the functions $$h\_2 = AO7(\neg V[2], \neg U[1]), \neg U[2]),$$
$$k\_3 = v\_2 \& h\_1 = V[2] \& V[1] \& U[0]$$
$$= NOR3(\neg V[2], \neg V[1], \neg U[0]),$$
$$v\_3 = V[2] \& V[1] \& V[0] = NOR3(\neg V[2], \neg V[1], \neg V[0])).$$

If n=4, the circuit HKV_n will have the functions $$h\_2 = U[3] \vee V[3] \& U[2] = AO7(\neg V[3], \neg U[2]), \neg U[3]),$$
$$k\_4 = AOI(\neg U[1], \neg k\_2, \neg V[3], \neg V[2]),$$
$$k\_2 = V[1] \& U[O] = NOR(\neg V[1], \neg V[0]),$$
$$V\_4 = NOR3(\neg V[3], \neg V[2], \neg v\_2), v\_2 = V[1] \& V[O]$$
$$= NOR(\neg V[1], \neg V[0]).$$

Therefore, this circuit is obtained by connecting outputs V and K of subcircuit HKV_2 to appropriate inputs v_n_1 and k_n_1 of the next subcircuit. If n=1, ¬HKV_n and HKV_n do not exist.

To recursively construct circuits ¬HKV_n, HKV_n, ¬h_n and h_n, the number n__0 and n__1 is selected so that $F\_\{l-1\}<n\_0=F\_l$, $n\_1=F\_\{l-1\}$, where l is selected from a condition $F\_l<n=F\_\{l+1\}$. For subcircuits v_n and ¬v_n, balanced trees are constructed composed of the elements NAND and NOR so that levels composed of NAND alternate with levels composed of NOR. Also, elements with the greatest number of inputs are selected for upper levels of the tree to minimize both area and delay. Combinatorial depth of such circuit will not be more than (¼) log_2n+O(1).

The combinatorial depth of circuits ¬HKV_n and HKV_n will not exceed ⌈(l+1)/2⌉, and the depth of circuits ¬h_n and h_n will not exceed ⌈(l+1)/2⌉, if $n=F\_\{l+1\}$. Because $n\_0=F\_l$, $n\_00=F\_\{l-1\}$, $n\_01=F\_\{l-2\}$, and $n\_1=F\_\{l-1\}$, by inductive hypothesis $$D(HKV\_\{n\_00\}), D(HKV\_\{n\_1\}), D(\neg HKV\_\{n\_00\}),$$
$$D(HKV\_\{n\_1\} = \lceil(l+1)/2\rceil, D(h\_\{n\_01\}), D(\neg h\_\{n\_01\}),$$
$$D(v\_\{n\_01\}), D(\neg v\_\{n\_01\}) = \lceil(l+1)/2\rceil, D(h\_\{n\_1\}),$$
$$D(\neg h\_\{n\_1\}), D(HKV\_\{n\_0\}), D(\neg HKV\_\{n\_0\}) = \lceil l/2 \rceil,$$

Therefore, $$D(HKV\_n), D(\neg HKV\_n) =$$
$$1 + \max\{D(HKV\_\{n\_00\}), D(\neg HKV\_\{n\_00\}, D(HKV\_\{n\_1\}),$$
$$D(\neg HKV\{n\_1\}), D(h\_\{n\_01\}), D(\neg v\_\{n\_01\})\} =$$
$$1 + \lceil(l-1)/2\rceil = \lceil(l+1)/2\rceil, , D(h\_n),$$
$$D(\neg h\_n) = 1 + \max\{D(HKV\_\{n\_0\}),$$
$$D(\neg HKV\{n\_0\}, D(h\_\{n\_1\}), D(\neg h\_\{n\_1\})\} = 1 + \lceil(l+1)/2\rceil.$$

Figure 16:
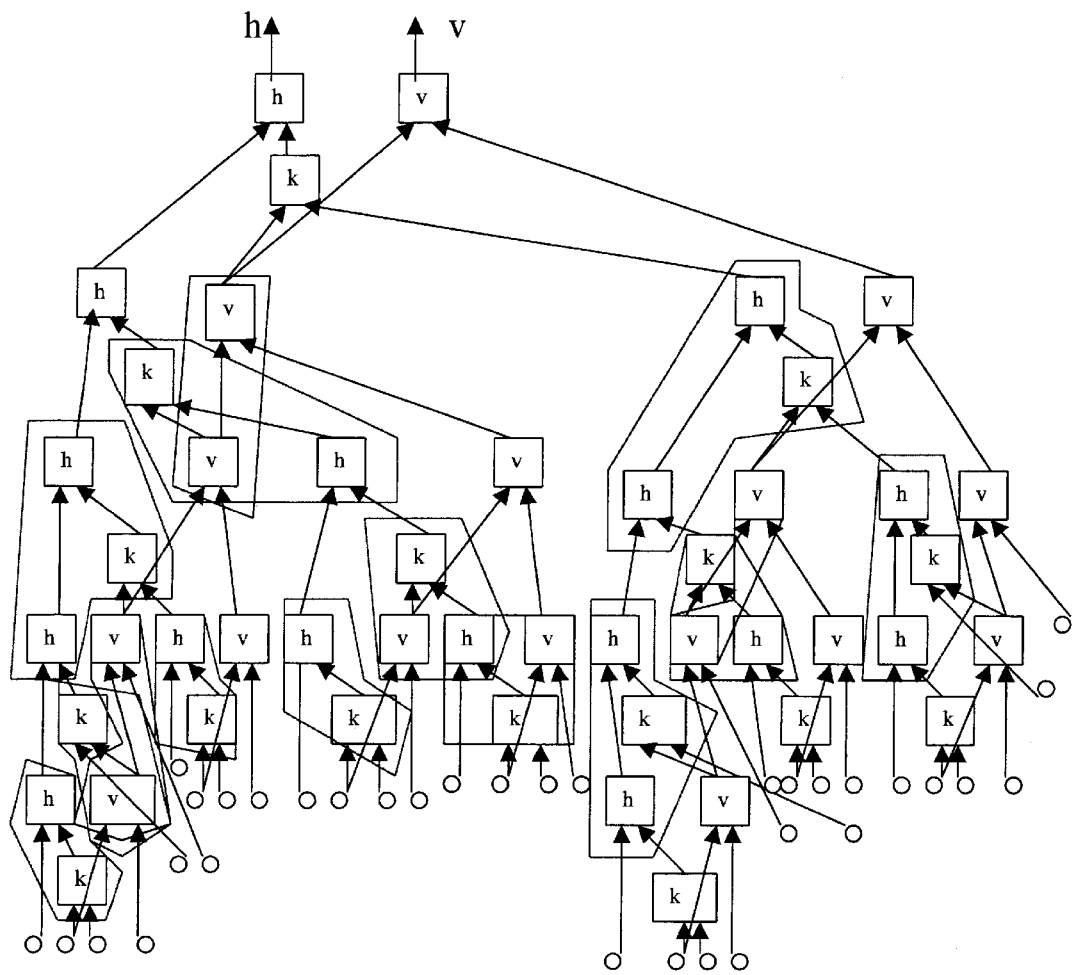
FIG. 16 illustrates a 2-output comparator using 2-input elements according to an embodiment of the present invention.
Figure 17:
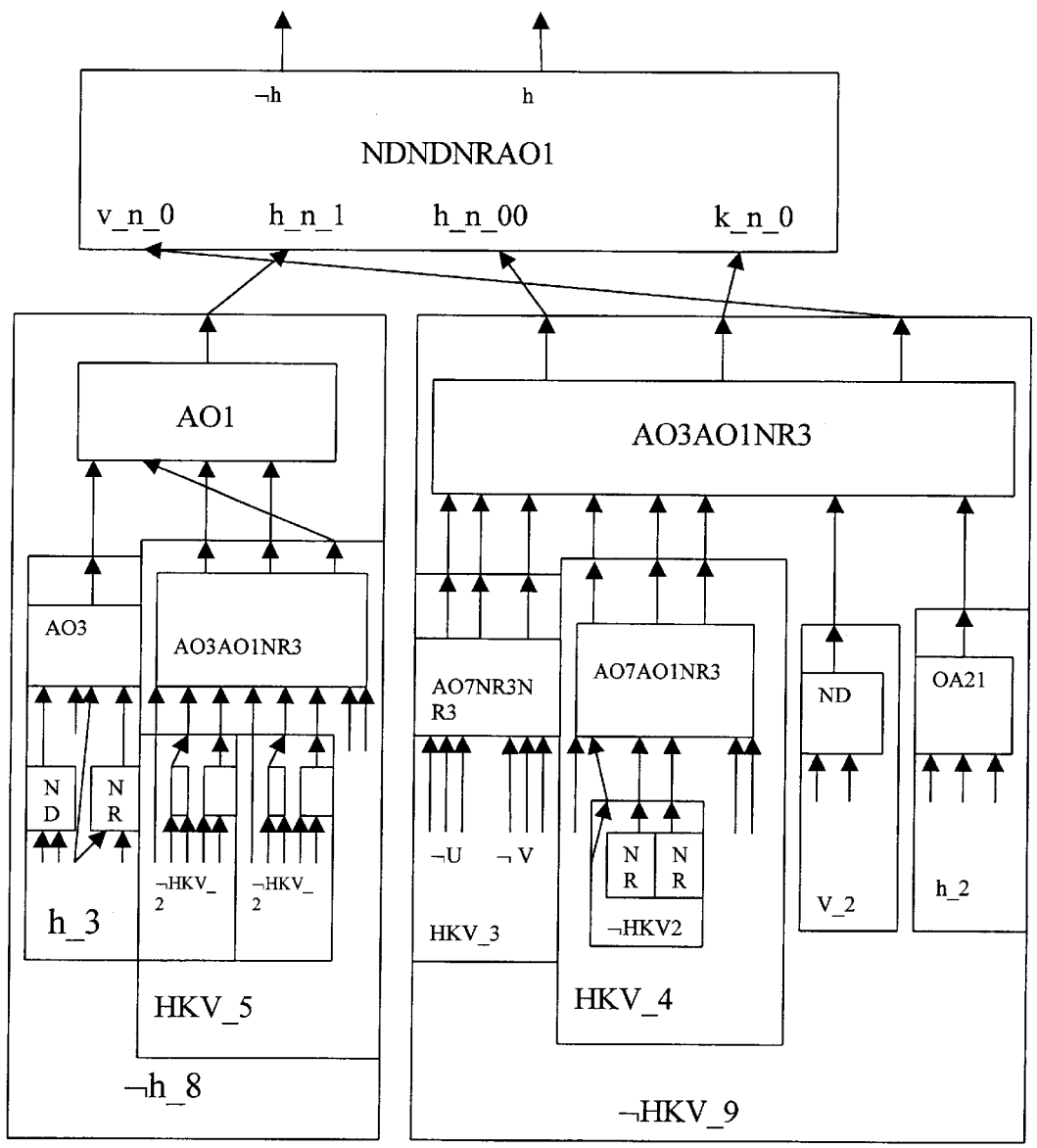
FIG. 17 illustrates a 2-output comparator using 4-input elements according to an embodiment of the present invention.

Based on the above, FIG. 16 illustrates the completed left-side Fibonacci circuit for module hv__17 of a 16-bit, 2-output comparator using 2-input elements mapped to a 4-input and 3-input library. FIG. 17 illustrates a left-side Fibonacci circuit for module hv__17 of a 16-bit, 2-output comparator using 4-input elements. In both cases, the constructed circuit has half of the depth of the circuit of 2-input circuit described in the previous section. Moreover, the optimization of distribution of negations may be applied to the present circuit as well.

With the present invention, standard 2-input elements in a library of elements are mapped from 3-input elements, and the 2-input elements can be combined to 4-input elements, such as AO21 and OA21 elements. A comparator may be constructed to perform both strict and non-strict inequality based on the value of the LEQ input. The Fibonacci circuit is used for the function $$h\_\{n+1\}=h\_\{n+1\}(LEQ, U[0], V[0], U[1], V[1], \ldots, U[n-1], V[n-1]$$

which has the same depth as the Fibonacci circuit for a comparator performing only a strict inequality if n is not a Fibonacci number.

For a 6-output comparator realizing all relations between two given numbers, the Fibonacci circuit is constructed for functions $h\_\{n\}$, $NOT(h\_n)$, $v\_n$, $NOT(v\_n)$, $OR(h\_n, v\_n)$ and $NOR(h\_n, v\_n)$. This circuit has the same depth as a Fibonacci circuit for a comparator realizing only a strict inequality if n is not Fibonacci number.

The Fibonacci circuit can also be implemented as a comparator for both unsigned and 2's complement numbers. A variant of the Fibonacci circuit is constructed from 4-input elements AO1 and AO, although such a circuit has half of the depth against that described above.

The present invention thus provides a circuit embodied in an integrated circuit characterized by an architecture having a minimal depth defined by a recursive expansion of functions $h\_n=OR(h\_k, AND(v\_k, h\_\{n-k\}))$ and $v\_n=AND(v\_k, v\{n-k\})$, where $k=F\_l$ and $n-k=F\_\{l-1\}$, l satisfies $F\_l<n=F\_\{l+1\}$, $F\_l$ is a Fibonacci series and n is the number of bits of an input to the circuit.

The circuit is embodied as a comparator and is further characterized by output functions $h\_n$ and $v\_n$ depending from input functions $U[i]=AND(NOT(A[i]), B[i])$ and $V[i]=OR(NOT(A[i]), B[i])$, where $A[i]$ and $B[i]$ are inputs to the comparator, and functions $h\_n$, $v\_n$ are defined as follows $$h\_n = h\_n(U[0], U[1], V[1], \ldots, U[n-1], V[n-1])$$
$$= OR(U[n-1], AND(V[n-1], U[n-2], \ldots,$$
$$AND(V[n-1], \ldots, V[1], U[0])), \text{ and}$$
$$v\_n = v\_n(V[0], \ldots, V[n-1])$$
$$= AND(V[0], \ldots, V[n-1]).$$

In some embodiments, the comparator includes an LEQ input that operates the comparator to strict or non-strict inequality comparison.

The circuit uses logic elements having a function OR(NOT(a),b) instead of EXCLUSIVE OR functions, and uses OR logical functions in place of NOR functions and AND logical functions in place of NAND functions.

The circuit functions may be carried out using 2-input elements mapped from 3-element functions of a library and/or using 4-element functions derived from the 2-element functions. One embodiment is a 6-output comparator.

In another embodiment of the invention, a comparator is designed for inclusion in an integrated circuit. At least one output function of the comparator is defined in terms of a Fibonacci series. The output function is recursively expanded to find a minimum parameter of the Fibonacci series.

In preferred embodiments, recursive functions
$h\_n=OR(h\_k, AND(v\_k, h\_\{n-k\}))$ and
$v\_n=AND(v\_k, v\_\{n-k\}$,
are based on the output function, where $k=F\_l$ and $n-k=F\_\{l-1\}$, l satisfies $F\_l<n=F\_\{l+1\}$, $F\_l$ is the Fibonacci series defined recursively from the equality $F\_\{l+1\}=F\{l\}+F\_\{l+1\}$ and n is the number of bits of an input to the comparator. These functions are recursively expanded to minimize l.

In other embodiments, a distribution of negations of modules of the comparator is optimized. A set of delay vectors is identified and recursively compared to derive a set of minimum vectors. A vector having a minimum norm is selected from the set of minimum vectors.

In one form, the invention is carried out though use of a computer programmed to carry out the process. A computer readable program code is embedded in a computer readable storage medium, such as a disk drive, and contains instructions that cause the computer to carry out the steps of the process of designing a Fibonacci circuit in the form of a comparator using existing cell libraries. More particularly, instructions enable the computer to map existing 3-input elements to 2-input elements of smaller depth and arrange the elements to perform functions of comparison of inputs to the comparator using an architecture based on a Fibonacci series.

Although the present invention has been described with reference to preferred embodiments, workers skilled in the art will recognize that changes may be made in form and detail without departing from the spirit and scope of the invention.

What is claimed is:

1. A circuit embodied in an integrated circuit characterized by an architecture having minimal depth defined by a recursive expansion of output functions $h\_n=OR(h\_k, AND(v\_k, h\_\{n-k\}))$ and $v\_n=AND(v\_k, v\{n-k\})$, where $k=F\_l$ and $n-k=F\_\{l-1\}$, l satisfies $F\_l<n=F\_\{l+1\}$, $\{F\_l\}$ is a Fibonacci series and n is the number of bits of an input to the comparator.

2. The circuit of claim 1 wherein the circuit operates as a comparator and is further characterized by providing output functions $h\_n$ and $v\_n$ depending from input functions $U[i]=AND(NOT(A[i]), B[i])$ and $V[i]=OR(NOT(A[i]), B[i])$, where $A[i]$ and $B[i]$ are inputs to the comparator, and functions $h\_n$, $v\_n$ are defined as $$h\_n = h\_n(U[0], U[1], V[1], \ldots, U[n-1], V[n-1])$$
$$= OR(U[n-1], AND(V[n-1], U[n-2]), \ldots,$$
$$AND(V[n-1], \ldots, V[1], U[0])), \text{ and}$$
$$v\_n = v\_n(V[0], \ldots, V[n-1])$$
$$= AND(V[0], \ldots, V[n-1]).$$

3. The comparator of claim 2, further characterized by the inclusion of logic elements providing OR(NOT(a),b) functions and an exclusion of logic elements providing EXCLUSIVE OR functions.

4. The circuit of claim 1, further characterized by the inclusion of logic elements providing OR functions and an exclusion of elements providing NOR functions, and by the inclusion of logic elements providing AND logical functions and an exclusion of elements providing NAND functions.

5. The circuit of claim 1, wherein n is not a member of the Fibonacci series.

6. The circuit of claim 4, including an LEQ input that operates the circuit to strict or non-strict inequality comparison.

7. The circuit of claim 1, wherein one of the functions is a negation of the other function.

8. The circuit of claim 1, wherein the functions are carried out using 2-input elements.

9. The circuit of claim 1, further characterized by including six outputs defining functions of $h\_n$, $NOT(h\_n)$, $v\_n$, $NOT(v\_n)$, $OR(h\_n, v\_n)$ and $NOR(h\_n, v\_n)$.

10. A process of designing a circuit structure for an integrated circuit comprising steps of:
   a) defining at least one output function of the output in terms of a Fibonacci series; and
   b) recursively expanding the output function to find a minimum parameter of the Fibonacci series.

11. The process of claim 10, wherein step (b) comprises steps of:
   b1) defining recursive functions
   $h\_n = OR(h\_k, AND(v\_k, h\_\{n-k\}))$ and
   $v\_n = AND(v\_k, v\_\{n-k\})$, based on the output function, where $k=F\_l$ and $n-k=F\_\{l-1\}$, l satisfies $F\_l < n = F\_\{l+1\}$, $\{F\_l\}$ is the Fibonacci series defined recursively from the equality $F\_\{l+1\} = F\{l\} + F\_\{l+1\}$ and n is the number of bits of an input to the circuit, and
   b2) recursively expanding the recursive functions to minimize l.

12. The process of claim 11, wherein the circuit structure is a comparator structure and the process further includes steps of:
   c) defining input functions U[i] and V[i] as
   $U[i] = AND(NOT(A[i]), B[i])$ and
   $V[i] = OR(NOT(A[i]), B[i])$,
   where A[i] and B[i] are inputs to the comparator, and
   d) defining output functions $h\_n$ and $v\_n$ as $$h\_n = h\_n(U[0], U[1], V[1], \ldots, U[n-1], V[n-1])$$
$$= OR(U[n-1], AND(V[n-1], U[n-2]), \ldots,$$
$$AND(V[n-1], \ldots, V[1], U[0])), \text{ and}$$
$$v\_n = v\_n(V[0], \ldots, V[n-1])$$
$$= AND(V[0], \ldots, V[n-1]).$$

13. The process of claim 12, wherein $v\_n$ is a negation of $h\_n$.

14. The process of claim 10, further including steps of:
   c) optimizing a distribution of negations of modules of the circuit.

15. The process of claim 14, wherein step (c) comprises, for each module of the circuit, steps of:
   c1) identifying a set of delay vectors,
   c2) recursively comparing the delay vectors to derive a set of minimum vectors, and
   c3) selecting a vector with a minimum norm from the set of minimum vectors.

16. The process of claim 10, further including steps of:
   c) mapping 3-input elements from a library to 2-input elements, and
   d) implementing the circuit structure using elements selected from the group consisting of 2-input elements and 4-input elements.

17. A storage medium having stored therein
   first processor executable instructions that enable a processor to define a circuit structure for an integrated circuit comprising elements that define at least one output function in terms of a Fibonacci series; and
   second processor executable instructions that enable the processor to recursively expand the output function to find a minimum parameter of the Fibonacci series.

18. The storage medium of claim 17, wherein the second processor executable instructions includes:
   processor executable instructions that enable the processor to define recursive functions
   $h\_n = OR(h\_k, AND(v\_k, h\_\{n-k\}))$ and
   $v\_n = AND(v\_k, v\_\{n-k\})$, based on the output function, where $k=F\_1$ and $n-k=F\_\{l-1\}$, l satisfies $F\_l < n = F\_\{l+1\}$, $\{F\_l\}$ is the Fibonacci series defined recursively from the equality $F\_\{l+1\} = F\{1\} + F\_\{l+1\}$ and n is the number of bits of an input to the circuit, and
   processor executable instructions that enable the processor to recursively expand the recursive functions to minimize l.

19. The storage medium of claim 18, wherein the circuit structure is a comparator structure, the storage medium further including:
   processor executable instructions that enable the processor to define input functions U[i] and V[i] as
   $U[i] = AND(NOT(A[i]), B[i])$ and
   $V[i] = OR(NOT(A[i]), B[i])$,
   where A[i] and B[i] are inputs to the comparator, and
   processor executable instructions that enable the processor to define output functions $h\_n$ and $v\_n$ as $$h\_n = h\_n(U[0], U[1], V[1], \ldots, U[n-1], V[n-1])$$
$$= OR(U[n-1], AND(V[n-1], U[n-2]), \ldots,$$
$$AND(V[n-1], \ldots, V[1], U[0])), \text{ and}$$
$$v\_n = v\_n(V[0], \ldots, V[n-1])$$
$$= AND(V[0], \ldots, V[n-1]).$$

20. The storage medium of claim 17, further including:
   processor executable instructions that enable the processor to identify a set of delay vectors for each module of the circuit,
   processor executable instructions that enable the processor to recursively compare the delay vectors of each set of delay vectors to derive a set of minimum vectors, and
   processor executable instructions that enable the processor to select a vector with a minimum norm from each set of minimum vectors to thereby optimize distribution of negations for each module.

21. The storage medium of claim 17, further including processor excutable instructions that enable the processor to map 2-input elements from a cell library of 3-input elements.

* * * * *